United States Patent [19]
LeCroy, Jr. et al.

[11] Patent Number: 5,218,363
[45] Date of Patent: Jun. 8, 1993

[54] HIGH-SPEED SWITCHING TREE WITH INPUT SAMPLING PULSES OF CONSTANT FREQUENCY AND MEANS FOR VARYING THE EFFECTIVE SAMPLING RATE

[75] Inventors: Walter O. LeCroy, Jr., Piermont; Brian V. Cake, Monroe, both of N.Y.

[73] Assignee: LeCroy Corporation, Chestnut Ridge, N.Y.

[21] Appl. No.: 760,165

[22] Filed: Sep. 16, 1991

Related U.S. Application Data

[63] Continuation-in-part of Ser. No. 743,695, Jun. 11, 1985, abandoned, which is a continuation of Ser. No. 367,374, Apr. 12, 1982, abandoned.

[51] Int. Cl.⁵ .......................................... H03M 1/00
[52] U.S. Cl. ................................... 341/123; 341/79; 341/100; 307/244; 307/605
[58] Field of Search ............... 307/254, 255, 243, 244, 307/605; 341/79, 100, 101, 122, 123, 148

[56] References Cited

U.S. PATENT DOCUMENTS

| | | | |
|---|---|---|---|
| 3,061,682 | 10/1959 | Cirone | 370/112 |
| 3,142,822 | 7/1964 | Martin | 365/149 |
| 3,182,202 | 5/1965 | Hesketh | 307/254 |
| 3,312,941 | 4/1967 | Booth | 307/255 |
| 3,531,720 | 9/1970 | Norsworthy | 324/77 E |
| 3,614,327 | 10/1971 | Easton | 307/243 |
| 3,714,623 | 1/1973 | Mickler | 340/853.9 |
| 3,761,809 | 9/1973 | Lockitt | 324/77 R |
| 3,820,112 | 6/1974 | Roth | 341/899 |
| 3,885,167 | 5/1975 | Berglund | 377/57 |
| 4,023,159 | 5/1977 | Miyakawa | 341/140 |
| 4,078,204 | 3/1978 | Gauthier | 328/21 |
| 4,196,358 | 4/1980 | Conover et al. | 307/254 |
| 4,291,299 | 9/1981 | Hinz | 341/123 |
| 4,314,162 | 2/1982 | Tsuchiya et al. | 307/255 |
| 4,795,923 | 1/1989 | Dobos | 307/605 |
| 4,862,020 | 8/1989 | Cowan et al. | 307/263 |

*Primary Examiner*—Howard L. Williams
*Attorney, Agent, or Firm*—Curtis, Morris & Safford

[57] ABSTRACT

Current switching apparatus including at least one current switching tree comprised of cascaded sets of switching circuits, with an input set operable with sampling clock pulses supplied at a fixed frequency and the remaining cascaded sets operable at different frequencies, and further including a sample skipping circuit interconnected between successive sets for reducing the effective sampling frequency of the switching tree while maintaining the fixed frequency at which the input set operates. The sample skipping circuit includes a dump circuit selectively energized to dump selected samples produced by the input set. When the apparatus is formed of plural switching trees of different phases, a sampling clock generator having an adjustable delay circuit is used to delay sampling clock pulses by adjustable amounts so as to establish predetermined phases of sampling clock pulses of the same frequency and different phases for use in each switching tree.

37 Claims, 13 Drawing Sheets

FIG. 3A
FIG. 3B  1,000 MHZ
FIG. 3C  500 MHZ
FIG. 3D  125 MHZ
FIG. 3E  125 MHZ
FIG. 3F  125 MHZ
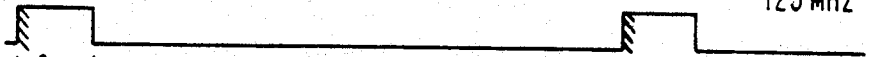
FIG. 3G  125 MHZ
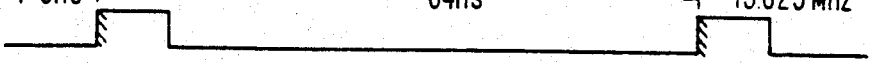
FIG. 3H  15.625 MHZ
FIG. 3I
FIG. 3J
FIG. 3K
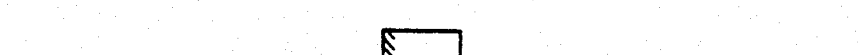
FIG. 3L
FIG. 3M
FIG. 3N
FIG. 3O
FIG. 3P
FIG. 3Q
FIG. 3R
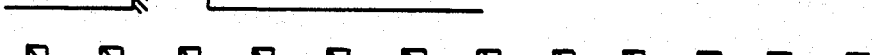
FIG. 3S
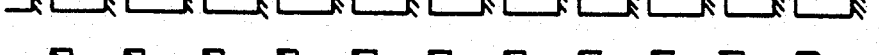
FIG. 3T
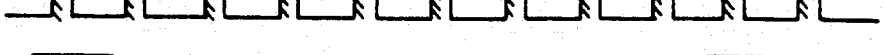
FIG. 3U

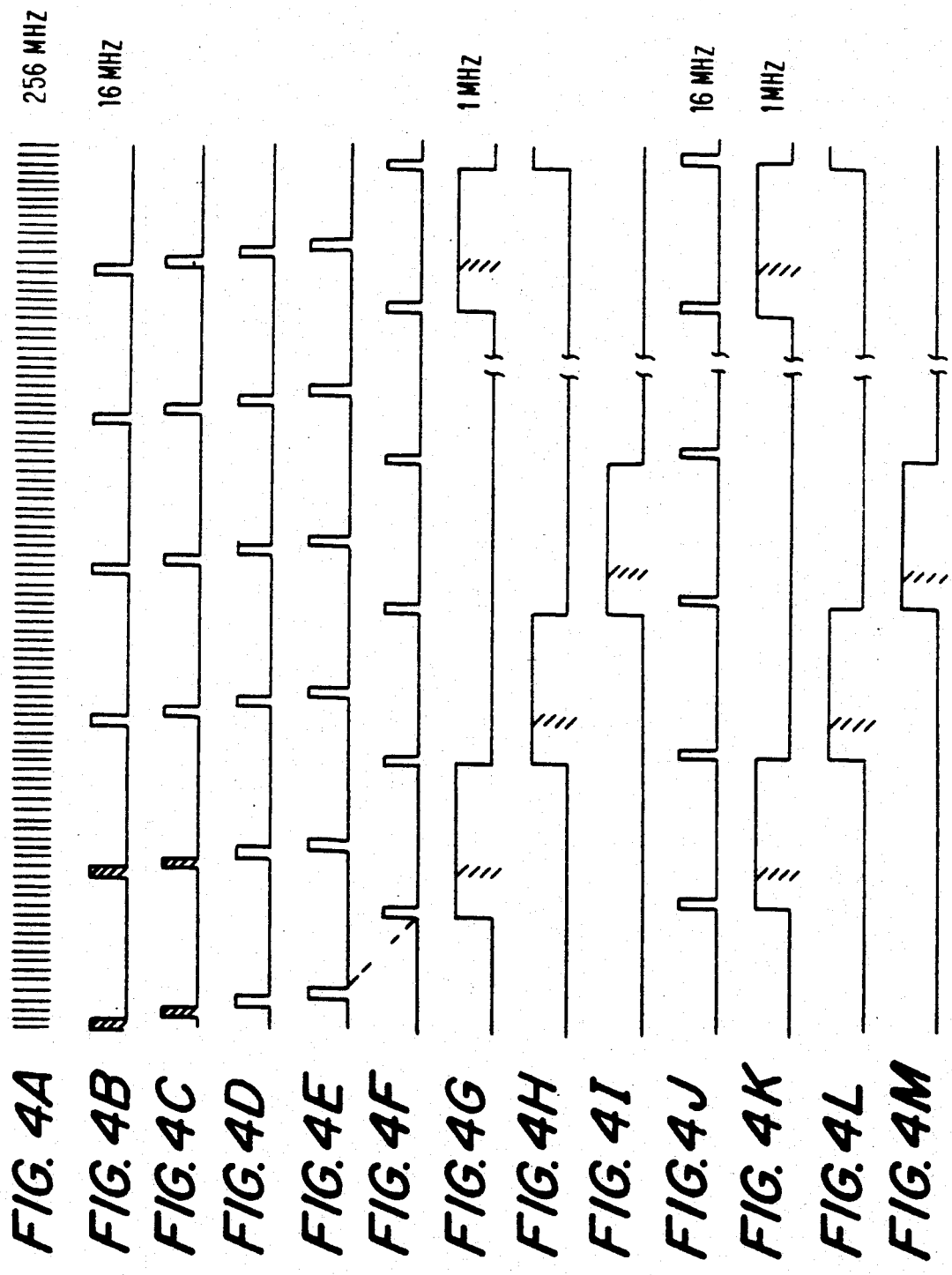

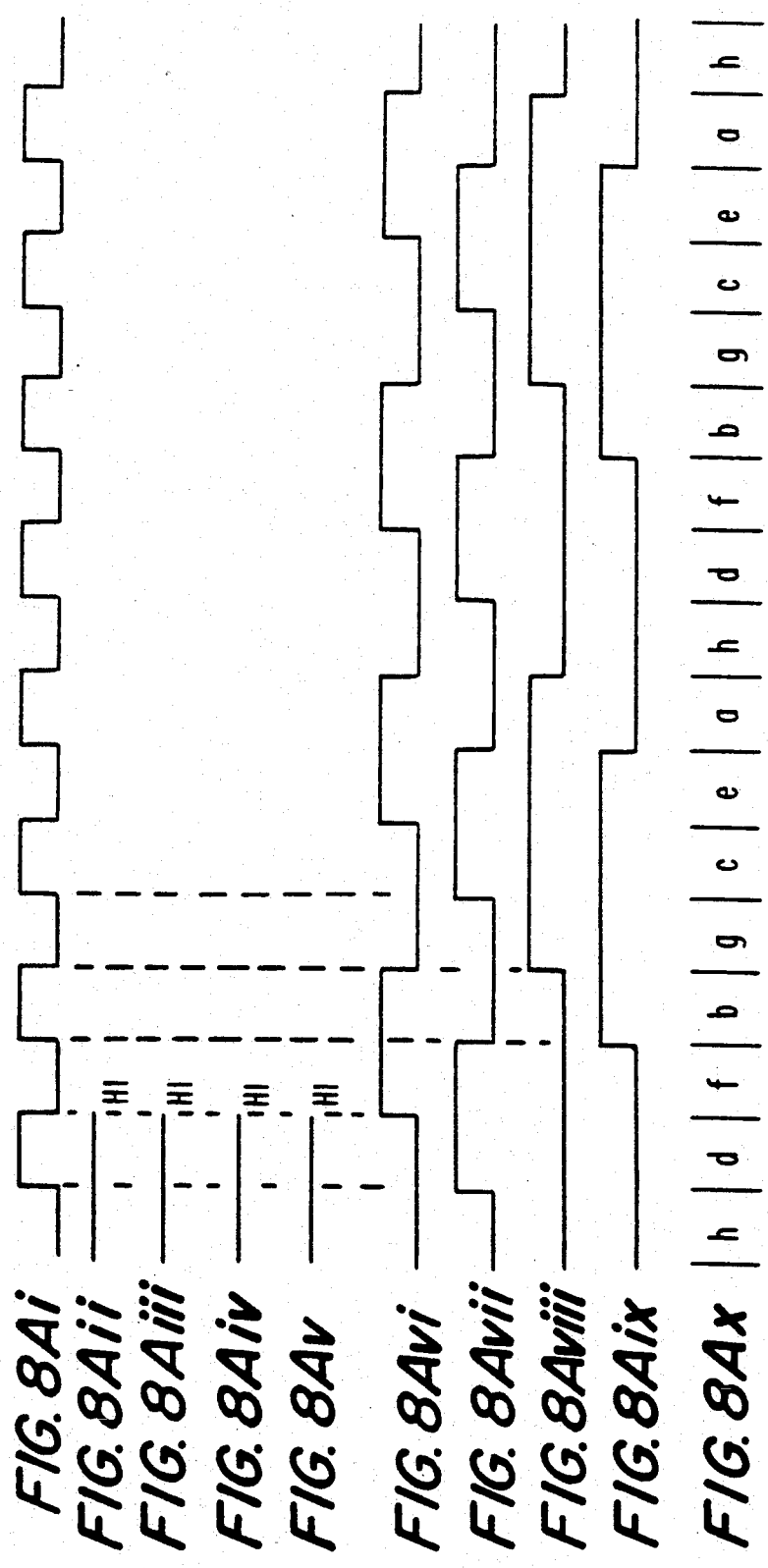

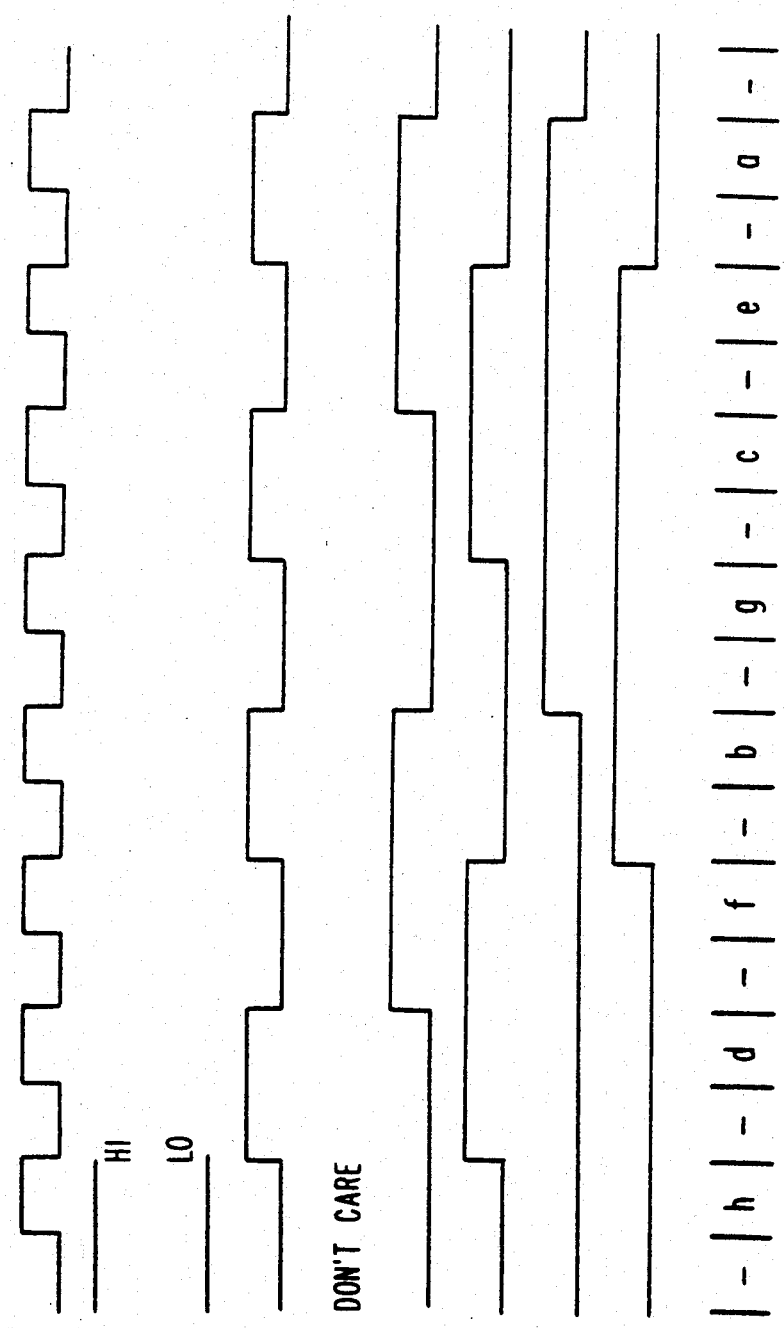

FIG.8Ci
FIG.8Cii
FIG.8Ciii
FIG.8Civ
FIG.8Cv
FIG.8Cvi
FIG.8Cvii
FIG.8Cviii
FIG.8Cix
FIG.8Cx

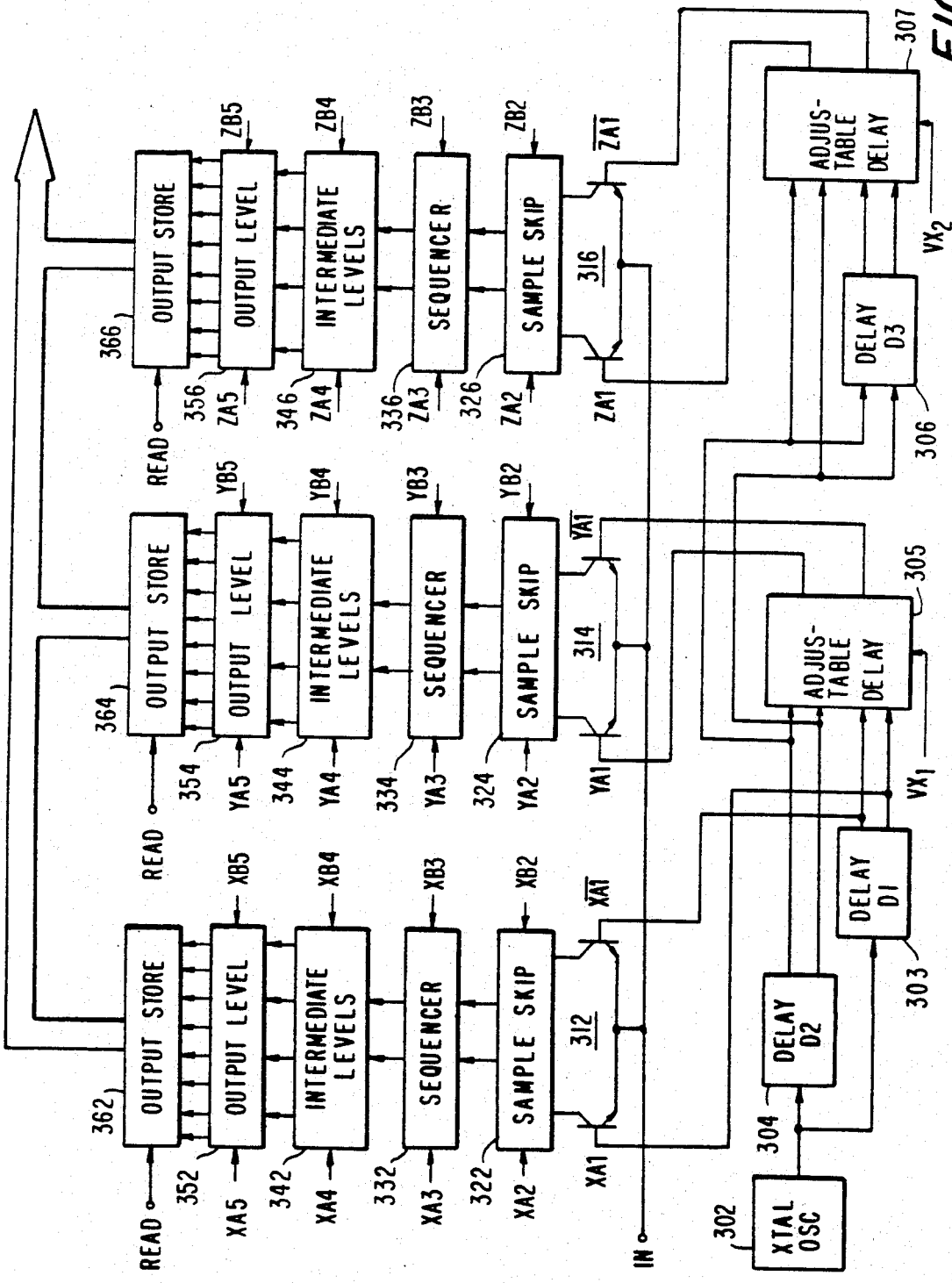

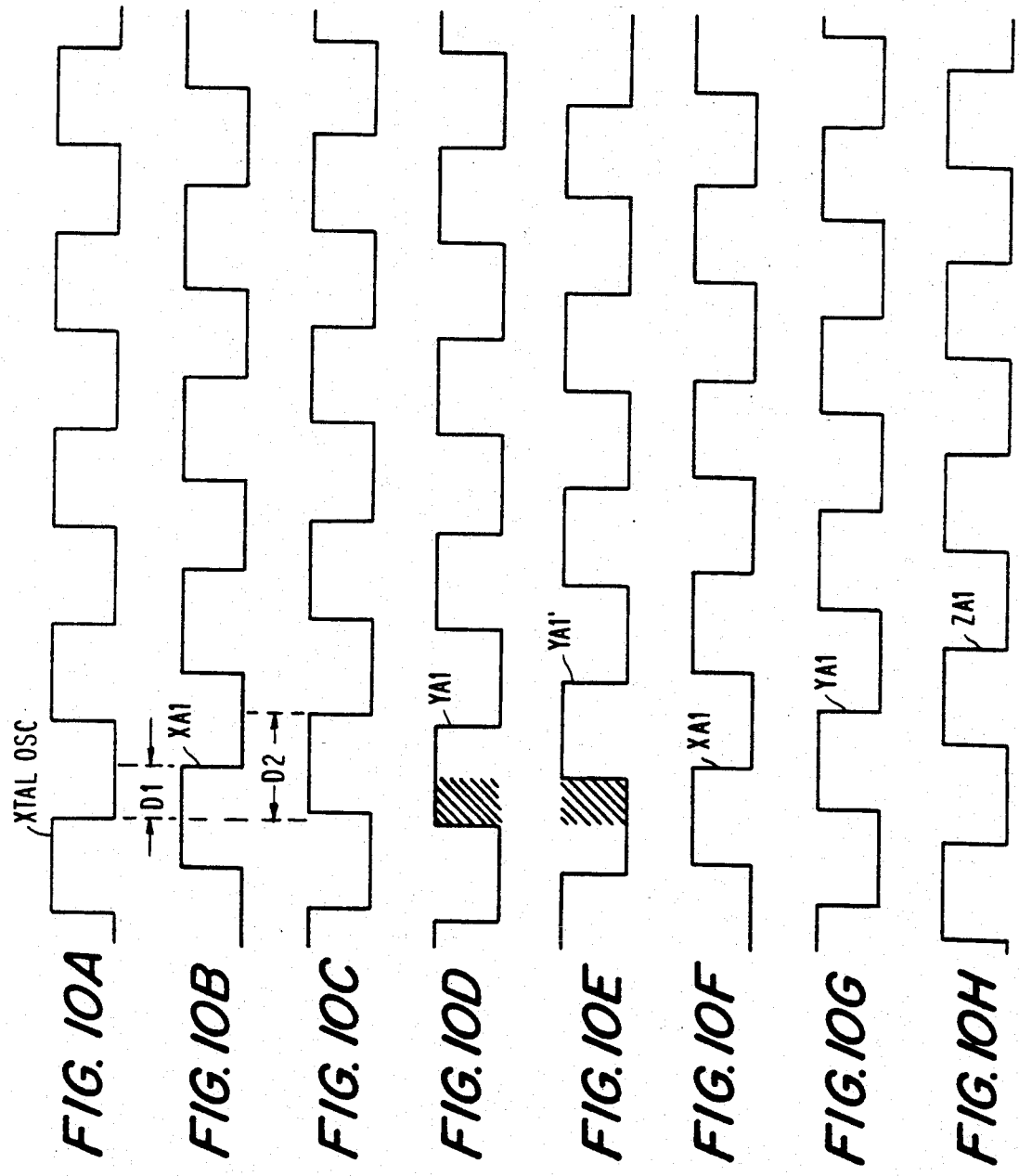

HIGH-SPEED SWITCHING TREE WITH INPUT SAMPLING PULSES OF CONSTANT FREQUENCY AND MEANS FOR VARYING THE EFFECTIVE SAMPLING RATE

This is a continuation-in-part or copending application Ser. No. 743,695, filed Jun. 11, 1985, now abandoned, which is a continuation of U.S. Ser. No. 367,374, filed Apr. 12, 1982, now abandoned.

BACKGROUND OF THE INVENTION

This invention relates to high-speed current switching circuitry and, more particularly, to a current switching tree having cascaded sets of switching circuits with an input set being driven at a constant, fixed sampling rate and with means for reducing the effective sampling frequency of the tree while maintaining said constant, fixed sampling rate.

As described in the aforementioned specification, a high-speed current sampling circuit is formed as a switching tree comprised of successive, cascaded sets of switching circuits, with each succeeding set being supplied with sampling pulses of reduced frequency. This switching tree permits the sampling at a satisfactorily high rate of an input signal having high frequency components, while enabling each sample which is produced at the aforementioned high rate to be processed at a relatively lower speed. Thus, current samples can be produced on the order of about 1 GHz; but each such sample may be stored temporarily and then digitized at a relatively low rate well within the operating capabilities of inexpensive analog-to-digital (A/D) converters.

Accurate operation of such high-speed switching circuits is dependent, to a large degree, upon the stability of the clock generator used to produce the sampling pulses supplied to the respective sets in the switching tree. Typically, a crystal oscillator is used as a reference clock source because it exhibits a fixed, stable frequency at high repetition rates. Usually, circuit components are selected on the basis of their ability to switch quickly and accurately, without saturation and without being susceptible to drift, delays and phase shifts at high operating speeds. Good circuit design thus takes into account various capacitive components of the circuits being used. While the fabrication of such circuits as an integrated circuit minimizes deleterious influences at high operating speeds, optimum circuit design nevertheless is premised upon a particular operating rate at which the switching tree is driven.

Accordingly, it has been found that it is not an easy matter to operate an expensive, high-speed switching tree at low speeds because of the design considerations upon which the circuit design was based. That is, less than optimum performance is attained if the crystal oscillator normally used to supply sampling pulses to the switching tree is replaced by an oscillator exhibiting a lower repetition rate. Likewise, a switching tree designed for high operating speeds may not operate satisfactorily if the normally high repetition rate of the clock signals generated by the aforementioned crystal oscillator is divided by conventional frequency dividers, programmable dividers, or the like.

Although separate switching trees may be purchased for use at respectively different frequencies, with each tree being designed to operate at a respective one of those frequencies, the stockpiling of several switching trees, each for use at a separate operating speed, is redundant and expensive. Hence, there has been a need to provide a switching tree operable at various different effective sampling rates without sacrificing performance or operating characteristics regardless of the operating speed at which the sampling tree is used.

To increase the sampling speed of the aforementioned switching tree, it has been proposed to supply an input signal to be sampled to plural phases of switching trees, each operable at the same sampling rate but at respectively different phases. For example, if three phases of sampling trees are used, with the input set of each phase being driven at a sampling rate of $f_s$, an input signal supplied to these three phases is sampled at an effective sampling frequency of $3f_s$. It is important, however, particularly if the input signal exhibits very high frequency components, such as transients, that the respective phases of the sampling clock pulses supplied to these switching trees be maintained within strict limits. For instance, in the aforementioned example wherein three phases of switching trees are used, the sampling clock pulses should be supplied at 0°, 120° and 240° to these respective phases. It is difficult, however, to provide fine phase adjustments at the very high sampling frequencies exhibited by the sampling clock pulses.

OBJECTS OF THE INVENTION

Therefore, it is an object of the present invention to provide improved high-speed sampling circuitry which overcomes each of the aforenoted disadvantages and drawbacks.

Another object of this invention is to provide a high-speed switching tree supplied with an input sampling clock exhibiting a fixed, stable frequency, and including a sample skipping circuit which operates to reduce the effective sampling frequency of the switching tree while maintaining the fixed, stable frequency of the input sampling clock.

A further object of this invention is to provide a switching tree designed for high frequency operation yet operable at significantly lower effective sampling rates, thus increasing the versatility and usefulness of that switching tree.

An additional object of this invention is to provide a plural phase switching tree with each phase being driven at the same input sampling rate, wherein the respective phases of the input sampling clocks are accurately adjustable even though such sampling clocks operate at very high repetition rates in excess of 500 MHz.

Another object of this invention is to provide a delay adjustment circuit having particular utility in a plural phase switching tree of the aforenoted type.

A still further object of this invention is to provide improved control over a switching tree whose output samples are stored, read out and displayed on a device which operates asynchronously of the switching tree.

Various other objects, advantages and features of the present invention will become readily apparent from the ensuing detailed description, and the novel features will be particularly pointed out in the appended claims.

SUMMARY OF THE INVENTION

In accordance with this invention, a current switching tree is comprised of successive, cascaded sets of current sampling circuits, each set operating at a respective one of different repetition rates, with an input set being driven at a fixed, high frequency. The effective sampling rate of the switching tree is reduced by a sample skipping circuit interconnected between successive levels of the switching tree, for example, between the input level and a succeeding intermediate level. The sample skipping circuit is selectively energized to pass some samples and to block others.

As a feature of this invention, a sequencing circuit supplies those samples which are passed by the sample skipping circuit to differing switching circuits in, for example, an intermediate level from which the samples are coupled to storage devices at the output level, the sequencing circuit functioning to assure that substantially all of the storage devices in the output level are used, even though certain samples normally destined for those devices may be blocked.

As another feature of this invention, plural phases of the aforementioned switching tree are used to increase the effective sampling rate at which an input signal is sampled, even though a common sampling clock may be used to produce sampling clock pulses for all of the phases. An adjustable delay circuit is provided for delaying the sampling clock pulses produced by the sampling clock, thereby establishing predetermined phases of sampling clock pulses of the same frequency for use by the respective phases of switching trees.

As an aspect of this feature, the adjustable delay circuit is comprised of two differential circuits for receiving pulse signals that are delayed with respect to each other, both differential circuits being supplied with current from a current source, and wherein a current adjustment circuit operates to vary the current supplied by said source to one of the differential circuits relative to the current supplied to the other differential circuit, thereby producing an output pulse at a time of occurrence which varies as a function of the current adjustment circuit.

BRIEF DESCRIPTION OF THE DRAWINGS

The following detailed description, given by way of example, will best be understood in conjunction with the accompanying drawings in which:

FIGS. 3A-3U are timing diagrams which are useful in understanding the operation of the embodiment shown in FIG. 1;

FIGS. 4A-4M are timing diagrams which are useful in understanding the operation of the embodiment shown in FIG. 2;

FIGS. 8A-8C are waveform diagrams which are useful in understanding the operation of the present invention;

FIG. 9 is a block diagram illustrating another aspect of the present invention;

FIGS. 10A-10H are waveform diagrams which are useful in understanding the manner in which sampling clock pulses are produced for the embodiment shown in FIG. 9.

DETAILED DESCRIPTION OF CERTAIN PREFERRED EMBODIMENTS

Figure 1:
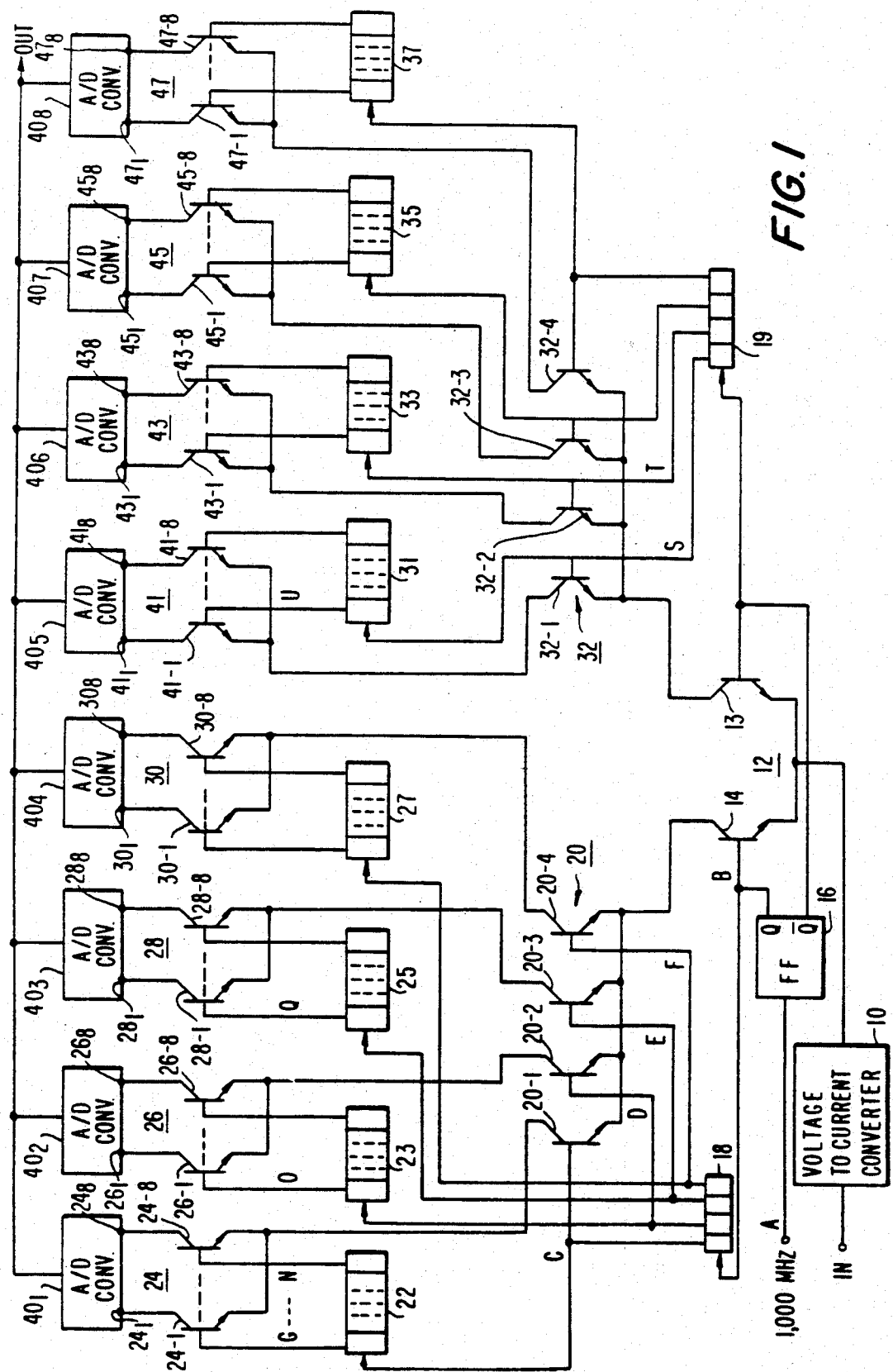
FIG. 1 is a schematic diagram of one embodiment of a switching tree used with the present invention.

Referring now to the drawings, FIG. 1 illustrates one embodiment of high-speed sampling apparatus in which the present invention finds ready application. The illustrated apparatus includes plural cascaded sets, or levels, of sampling circuits including an input set, or level 12, an output set, or level, including sampling circuits 24, 26, 28, 30, 41, 43, 45, and 47 and an intermediate set, or level, comprised of sampling circuits 20 and 32. These sets are seen to be cascaded from the input set to the intermediate set to the output set in the form of a sampling "tree". Input set 12 is comprised of a pair of switching elements 13 and 14. In one embodiment, the switching elements are comprised of transistor devices; and as shown in FIG. 1, such transistor devices may, for example, be bi-polar transistors. It will be appreciated by those of ordinary skill in the art that other types of transistor devices which are capable of operating at high switching frequencies may be used; and, moreover, the switching elements need not be limited solely to transistor devices. However, in the interest of brevity and simplification, it is assumed, for the purposes of discussion, that the illustrated switching elements are formed of transistor switching devices.

Input set 12 of switching devices 13, 14 includes a common-connected input, here illustrated as the emitter electrodes of transistors 13 and 14, adapted to be supplied with an input signal to be sampled. An input sample is obtained by actuating the switching device in response to a sampling signal supplied thereto. In particular, the sampling signal, such as a sampling pulse, supplied to the base electrode of, for example, transistor switch 14 renders this transistor switch conductive so as to couple the signal supplied to the emitter electrode thereof to its collector electrode. Switching devices 13 and 14 are operated, or actuated, at the same sampling rate, but at different respective phases. In particular, the switching devices are actuated alternatively.

The sampling pulses supplied to input set 12 are derived from a clock source (not shown) capable of generating stable, high frequency clock pulses on the order of, for example, 1,000 MHz. A frequency divider 16, formed of, for example, a flip-flop circuit, is coupled to the clock source and functions to divide the frequency of the clock pulses by the factor 2. As is conventional, flip-flop circuit 16 includes a pair of outputs Q and $\overline{Q}$, these outputs supplying sampling pulses at, for example, 500 MHz in opposite phases. Flip-flop circuit 16 may be thought of as a single stage shift register.

Since input set 12 of switching devices 13, 14 is comprised of only two switching devices in the example described herein, the input set is provided with two outputs. These outputs are coupled to respective inputs of the next set of sampling circuits. In the illustrated embodiment, this next set is comprised of the intermediate set, or level, of sampling circuits 20 and 32. Sampling circuits 20 and 32 may be thought of as separate groups of switching devices. These groups are of substantially identical construction, and only the group which comprises sampling circuit 20 need be described in detail.

In the illustrated example, sampling circuit 20 is comprised of four switching devices 20-1, 2-2, 20-3 and 20-4, respectively. Although any desired number of switching devices may be used, it is preferred herein to utilize four switching devices in sampling circuit 20. These switching devices may be similar to aforedescribed switching devices 13 and 14; and in the embodiment described herein, switching devices 20-1 . . . 20-4 are diagrammatically represented as transistor elements. The input of sampling circuit 20 is comprised of the common-connected inputs, or emitter electrodes, of switching devices 20-1, 20-2, 20-3 and 20-4. As illustrated, this input is coupled to the output, or collector electrode, of switching device 14 included in the input set 12 of sampling circuits. Similarly, the input of sampling circuit 32 is comprised of common-connected emitter electrodes coupled to the output, or collector electrode, of switching device 13.

Switching devices 20-1, 20-2, 20-3 and 20-4 are actuated, or rendered conductive, in sequence. The actuation, or conductivity, of these switching devices is determined by the successive phases of sampling pulses supplied thereto by a source of intermediate level sampling pulses 18. In a similar manner, the respective switching devices included in sampling circuit 32 are actuated, or rendered conductive, in sequence, by the respective phases of sampling pulses supplied thereto from source 19. Sources 18 and 19 may be thought of as suitable sampling pulse (or clock pulse) generators, each coupled to receive a respective phase of the first-level sampling pulses. More particularly, each of sampling pulse sources 18 and 19 is comprised of a plural-stage shift register adapted to receive a sample pulse generated by flip-flop circuit 16 to propagate a pulse through the respective stages thereof. Each stage of shift register 18 is coupled to a respective control terminal, or base electrode, of switching devices 20-1, 20-2, 20-3 and 20-4. Likewise, each stage of shift register 19 is coupled to a respective control terminal of the switching devices included in sampling circuit 32. Thus, as a pulse is shifted from stage-to-stage in shift register 18 in response to each sampling pulse supplied thereto from flip-flop circuit 16, successive ones of the switching devices included in sampling circuit 20 are actuated, or rendered conductive. It is appreciated that when a switching device is actuated, a signal supplied to the input thereof, that is, the signal supplied to the common-connected inputs of the switching devices, is switched, or transferred, to the output of that actuated switching device.

The output of each switching device included in sampling circuit 20 is coupled to the input of a respective sampling circuit included in the output set, or level. Similarly, each output of sampling circuit 32 is coupled to the input of a respective sampling circuit included in the output set, or level. In the interest of brevity, only output sampling circuits 24, 26, 28, and 30 are described in detail. In the example described herein, each sampling circuit included in the output set, or level, is comprised of eight individual switching devices. Any other number of switching devices may be included in sampling circuits 24, 26, 28, 30, 41, 43, 45, and 47, as desired.

Sampling circuit 24 is illustrated in detail, and the switching devices 24-1 . . . 24-8 included therein have their inputs, or emitter electrodes, connected in common to the output, or collector electrode, of switching device 20-1 included in sampling circuit 20 of the preceding set, or level. Similarly, the inputs of the switching devices included in sampling circuit 26 are connected in common to the output of switching device 20-2, the inputs of the switching devices included in sampling circuit 28 are connected in common to the output of switching device 20-3, and the inputs of the switching devices included in sampling circuit 30 are connected in common to the output of switching device 20-4. Likewise, the inputs of the switching devices included in sampling circuit 41 are connected in common to the output of switching device 32-1, and the remaining sampling circuits 43, 45 and 47 are similarly connected to switching devices 32-2, 32-3 and 32-4, respectively.

The control terminals, or base electrodes, of switching devices 24-1 . . . 24-8 are coupled to a source 22 of sampling pulses. Preferably, source 22 is comprised of a plural-stage shift register whose input is coupled to a predetermined stage of shift register 18. In the illustrated embodiment, the input of shift register 22 is coupled to the output of the first stage of shift register 18. In response to each sampling pulse produced at the first stage of shift register 18, shift register 22 propagates a pulse from one stage therein to the next adjacent stage. The plural stages of shift register 22 are coupled to respective control terminals of switching devices 24-1 . . . 24-8 to sequentially actuate, or render conductive, those switching devices in response to the propagating, or shifting, of a pulse through the shift register.

In a similar manner, the control terminals of the switching devices included in sampling circuit 26 are coupled to the respective stages of a shift register 23 whose input is coupled to, for example, the second stage of shift register 18. Likewise, the control terminals of the switching devices included in sampling circuit 28 are coupled to the respective stages of a shift register 25 whose input is coupled to the third stage of shift register 18. Finally, the control terminals of the switching devices included in sampling circuit 30 are coupled to the respective stages of yet another shift register 27 whose input is coupled to the fourth output of shift register 18. The respective stages of shift register 19 are coupled to similar shift registers 31, 33, 35 and 37, whose stages, in turn, are coupled to the control terminals of the switching devices included in sampling circuits 41, 43, 45 and 47, respectively.

The outputs, or collector electrodes, of switching devices 24-1 . . . 24-8 included in sampling circuit 24 are coupled to respective output terminals $24_1$ . . . $24_8$ of the sampling circuit. Likewise, the outputs of the switching devices included in sampling circuit 26 are coupled to respective sampling circuit output terminals $26_1$ . . . $26_8$. Similarly, the outputs of the switching devices included in sampling circuit 28 are coupled to respective output terminals $28_1$ . . . $28_8$; and the outputs of the respective switching devices included in sampling circuit 30 are coupled to output terminals $30_1$ . . . $30_8$. These output terminals of the output set, or level, of sampling circuits are coupled to analog-to-digital (A/D) converting apparatus.

In the embodiment illustrated in FIG. 1, each sampling circuit 24, 26, . . . included in the output set, or level, is coupled to a respective A/D converter. Preferably, each A/D converter is a so-called "flash" converter of the type available from TRW Inc. and others. As is known to those of ordinary skill in the art, a flash converter is adapted to convert a signal sample level to a corresponding digital signal at a rapid read-out, or cycling, rate. A/D converters $40_1$, $40_2$, $40_3$, $40_4$, $40_5$, $40_6$, $40_7$ and $40_8$ have their output terminals connected to a common output. It will be appreciated that the digital signals produced by the A/D converters are supplied to this common input in a predetermined sequence such that there is no interference at the common-connected output terminals. For example, first the digitized signal sample produced by A/D converter $40_1$ in response to the sample provided at output terminal $24_1$ is read out; followed by the reading out of A/D converter $40_5$ of the digitized sample produced in response to the sample provided at output terminal $41_1$. Then, the digitized sample produced by A/D converter $40_2$ in response to the sample provided at output terminal $26_1$ is read out, followed by the reading out of the digitized sample produced by A/D converter $40_6$ in response to the sample provided at output terminal $43_1$. Hence, the digitized samples are read out in accordance with the following sequence: first, all of the digital signals produced in response to the samples supplied to the first inputs of the A/D converters are read out successively, then the digital signals produced by the A/D converters in response to the samples supplied to the second inputs thereof are read out successively, and so on. As a numerical example, eight A/D converters are provided, each having eight separate inputs, thus producing sixty-four successive digitized samples.

It is preferred to supply the input set, or level, of sampling circuits 12 with an input current. This is because currents are switched easily at high speeds by switching transistors, such as bipolar or MOS transistors. Furthermore, a current sample may be stored for relatively long periods of time on simple storage devices, such as capacitors. If a current sample i is switched, or steered, to a storage capacitor during a brief interval of time Δt, the charge that is deposited onto that capacitor is an exact measure of the average current i during that interval:

$$q = \int_{t_i}^{t_2} i\, dt = i\, \Delta t$$

Thus, the stored charge is a sample of the current waveform. The time interval Δt may be made very short, such as 1 nsec. or less, thereby enabling accurate sampling of signals having wide bandwidths. Accordingly, a voltage-to-current converter 10 is coupled to the input of sampling circuit 12. This voltage-to-current converter is adapted to convert an incoming signal voltage to a corresponding current. Then, depending upon the "train" of switching devices which are actuated, or in the cascaded sets, conductive, the input current flows through one or the other of input switching devices 13, 14, and then through one switching device included in the intermediate set, or level, followed by one switching device included in the output set, or level.

A timing diagram representing the switched operation of the various switching devices illustrated in FIG. 1 is shown in FIGS. 3A-3U. FIG. 3A represents the clock pulses supplied to flip-flop circuit 16 at the rate of, for example, 1,000 MHz. It is appreciated that the frequency, or pulse repetition rate, of the input clock pulses may be any desired frequency capable of being stably generated. Since flip-flop circuit 16, shift register 18 and shift register 22 each carry out binary frequency division, the frequency of the input clock signal (FIG. 3A) may, for convenience, be an integral multiple of a binary number, such as 1,024 MHz.

Flip-flop circuit 16 functions to divide the frequency of the clock pulses by the factor 2 to produce sampling pulses of opposite, alternate phases. FIG. 3B illustrates the sampling pulses produced at output Q of flip-flop circuit 16. It will be appreciated that the sampling pulses produced at the output Q is 180° out of phase with respect to the sampling pulses shown in FIG. 3B. Thus, transistors 14 and 13 are actuated, or rendered conductive, alternately.

The sampling pulses shown in FIG. 3B are supplied to shift register 18, to trigger the same to propagate a pulse through the respective stages of this shift register. FIGS. 3C-3F represent such propagation and it is seen that the pulses provided at the first stage of shift register 18 (FIG. 3C) exhibit the frequency of 125 MHz and a reference phase assumed herein to be 0°. The sampling pulses shown in FIG. 3D are produced at the second stage of shift register 18, and are seen to exhibit the same sampling frequency of 125 MHz and a phase assumed herein to be 90°. The sampling pulses shown in FIG. 3E are produced by the third stage of shift register 18; and these sampling pulses are seen to exhibit the frequency of 125 MHz and the phase of 180°. Finally, the sampling pulses shown in FIG. 3F are produced by the fourth stage of shift register 18, and exhibit the frequency of 125 MHz and the phase of 270°. The cross-hatched areas of the sampling pulse signals illustrated in FIGS. 3C-3F represent the input signal samples that are transferred through switching devices 20-1 . . . 20-4, respectively, during the duration of each of the respective sampling pulses (FIGS. 3C-3F). Thus, the first sample of the input signal which is produced by switching device 14 (and represented by the cross-hatched area of the first sampling pulse shown in FIG. 3B) is transferred, or switched, through switching device 20-1 during the first half of the duration of the sampling pulse shown in FIG. 3C. The second input signal sample produced by switching device 14 is transferred through switching device 20-2 during the first half of the duration of the sampling pulse shown in FIG. 3D. The third input signal sample produced by switching device 14 is transferred through switching device 20-3 during the first half of the duration of the sampling pulse illustrated in FIG. 3E. Finally, the fourth input signal sample produced by switching device 14 is transferred through snitching device 20-4 during the first half of the duration of the sampling pulse shown in FIG. 3F. Thereafter, the foregoing cycle is repeated.

It is appreciated, from the sampling pulses shown in FIG. 3B, that switching device 13 produces samples during the negative half portions of each cycle of the sample pulses shown in FIG. 3B. Shift register 19 generates respective phases of sampling pulses, two of which phases are shown in FIGS. 3S and 3T. The frequency of the pulses shown in FIG. 3S, as well as the frequency of the pulses shown in FIG. 3T, is equal to 125 MHz, the same frequency as the sampling pulses which are produced at each stage of shift register 18. The cross-hatched portion of each pulse shown in FIGS. 3S and 3T represents the input signal sample that is transferred through a respective switching device 32-1 and 32-2 included in sampling circuit 32 during the duration of the pulses shown in FIGS. 3S and 3T.

From the foregoing, it will be appreciated that the first input signal sample produced by switching device 14 is transferred through switching device 20-1, and then the first sample produced by switching device 13 is transferred through switching device 32-1. Thereafter, the second input signal sample produced by switching device 14 is transferred through switching device 20-2, and the next sample produced by switching device 13 is transferred through corresponding switching device 32-2. Hence, sampling circuits 20 and 32 alternate in transferring samples therethrough, and at each alternation, the next switching device included therein is actuated. If desired, the switching devices 20-1, 20-2, ..., and 32-1, 32-2, ..., may be actuated in any other sequence or order.

Shift register 22 responds to the pulses shown in FIG. 3C to propagate a sampling pulse through the plural stages thereof. As a result, sequential phases, each shifted by 45°, are provided at the outputs of the stages of shift register 22, as shown in FIGS. 3G-3N, respectively. It is seen that the frequency of each phase of these pulses is equal to one-sixth-fourth the input clock frequency. The cross-hatched areas shown in FIGS. 3G-3N represent the transfer of the input signal sample through the respective switching devices included in sampling circuit 24 during the duration of each respective phase of the sampling pulses supplied to this sampling circuit. FIGS. 3O and 3P represent two successive phases of the sampling pulses supplied from similar shift register 23 to sampling circuit 26. Likewise, FIGS. 3Q and 3R represent two successive phases of the sampling pulses produced by shift register 25 and supplied to sampling circuit 28.

It will be appreciated that sampling circuits 41, 43, 45 and 47 to which the respective outputs of sampling circuit 32 are coupled are driven by respective, sequential phases produced by shift registers 31, 33, 35 and 37, respectively. FIG. 3U represents one of these phases as produced by the first stage of shift register 31.

In the embodiment shown in FIG. 1, the first input signal sample produced by switching device 14 is coupled through switching device 20-1 and then through switching device 24-1 to A/D converter $40_1$. Thereafter, the first input signal sample produced by switching device 13 is coupled through switching device 32-1 and then through switching device 41-1 to A/D converter $40_5$. The next signal sample is produced by switching device 14, and at this time, shift register 18 actuates switching devices 20-2 to couple this sample therethrough and then through the first switching device included in sampling circuit 26. The next signal sample is produced by switching device 13, and this sample is coupled through switching device 32-2 and then through the first switching device included in sampling circuit 43 to A/D converter $40_6$. The next signal sample produced by switching device 14 is coupled through switching device 20-3 and then through the first switching device included in sampling circuit 28 to A/D converter $40_3$. This alternating sequence is repeated until all of the first switching devices included in sampling circuits 24, 26, 28 and 30 as well as in sampling circuits 41, 43, 45 and 47 have been actuated. Then, the sequence is repeated, and each second switching device included in each of the sampling circuits is actuated successively.

It is appreciated that the alternate actuation of switching devices 13 and 14 serves to sample the input signal at the rate of 1,000 MHz. Because of the illustrated multi-level "tree", each switching device included in the output set, or level of sampling circuits, that is, each switching device included in sampling circuits 24, 26, 28 ... is actuated at the rate of approximately 15 MHz. The A/D converters are capable of operating at this 15 MHz rate and, in combination, the A/D converters serve to produce digitized samples at the input sampling rate of 1,000 MHz. Hence, FIG. 1 is a schematic representation of one embodiment of a high-speed sampling circuit, each sample being converted to a corresponding digital representation.

In the embodiment of FIG. 1, it may be appreciated that, if desired, any number of intermediate sets, or levels, of sampling circuits may be used. In general, the input set may be thought of as having n outputs (e.g. n=2); the intermediate set may be thought of as having x outputs in each group of switching devices (e.g. x=4 for each of 2 groups); and the output set may be thought of as having n.x groups with each group having y outputs (e.g. y=8). In the illustrated embodiment only one intermediate set, comprised of two groups of sampling circuits 20 and 32, is used. Furthermore, the high-speed sampling circuit may be modified so as to include only an input and an output set of sampling circuits. In this regard, input sampling circuit 12 may be omitted; and the input signal may be coupled directly to the common-connected input of sampling circuit 20 as well as to the common-connected input of sampling circuit 32.

Still further, each A/D converter may include a storage device, such as a capacitance element, coupled to a respective output terminal of the sampling circuit connected thereto for the purpose of storing each sample. The stored sample then may be digitized at an appropriate rate which, for example, may be less than the 15 MHz rate at which the output sampling circuits are driven.

In the embodiment shown in FIG. 1, it might be thought that the multi-level tree of sampling circuits is a commutator circuit that is analogous to a single-pole-sixty-four-throw electronic switch. This, however, is not the case. Accurate samples at the high sampling rates described herein are not attainable if, for example, sixty-four transistors are connected with their emitter electrodes in common and supplied with the input signal to be successively sampled. This is because the very high base-emitter capacitance which obtains by reason of the common-connected emitters prevents the respective transistors from being switched, or actuated, at high sampling rates. It is known that the inherent base-emitter capacitance of a transistor is effectively increased as more transistors are connected with their emitters in common. Thus, with a large number (e.g. 64) of transistors connected in common, the resultant high capacitance of the common-connected emitters prevents each transistor from responding to the high frequency sampling pulses.

The sets of transistors shown in FIG. 1 are "matched" to the frequencies of the particular sampling pulses supplied thereto and, therefore, overcome the aforenoted problem. For example, the input set of switching devices includes a small number (e.g. 2) of transistors connected in common at their emitters. Hence, the effective emitter capacitance of the input set is relatively low and does not degrade the rapid response of these transistors to the very high frequency sampling pulses supplied thereto. The intermediate set of switching devices is formed of plural (e.g. 2) groups, each group including a somewhat larger number (e.g. 4) of transistors than the input set. Although this increases the effective emitter capacitance in each group of the intermediate set, the frequency of the sampling pulses supplied thereto is less than the input sampling pulses and, consequently, the transistors are fully enabled to respond thereto. Likewise, the output set of switching devices is formed of groups that include a still larger number (e.g. 8) of transistors, but the resultant increase in emitter capacitance thereof is effectively offset, or compensated, by a lower sampling pulse frequency. Hence, the transistors in the output set respond satisfactorily to the sampling pulses supplied thereto. Therefore, those groups of transistors having larger effective capacitances, and thus slower response speeds, are supplied with sampling pulses at a slower rate.

Thus, it is seen that the formation of groups of relatively small numbers of transistors reduces the effective capacitance that otherwise would be present if all of the output transistors were connected together. Another advantage of providing groups of transistors is the relative ease with which clock, or sampling, pulses may be generated. If a single clock generator is used, it is difficult to supply each transistor with its appropriate sampling pulse phase at the correct times.

By matching the sampling pulse repetition rates to the response speeds of the respective sets, the levels of the input signal samples are accurately preserved as those samples propagate through successive ones of the cascaded sets. A sample is not distorted because a particular transistor cannot be switched fast enough to pass that sample to the next stage.

Figure 2:
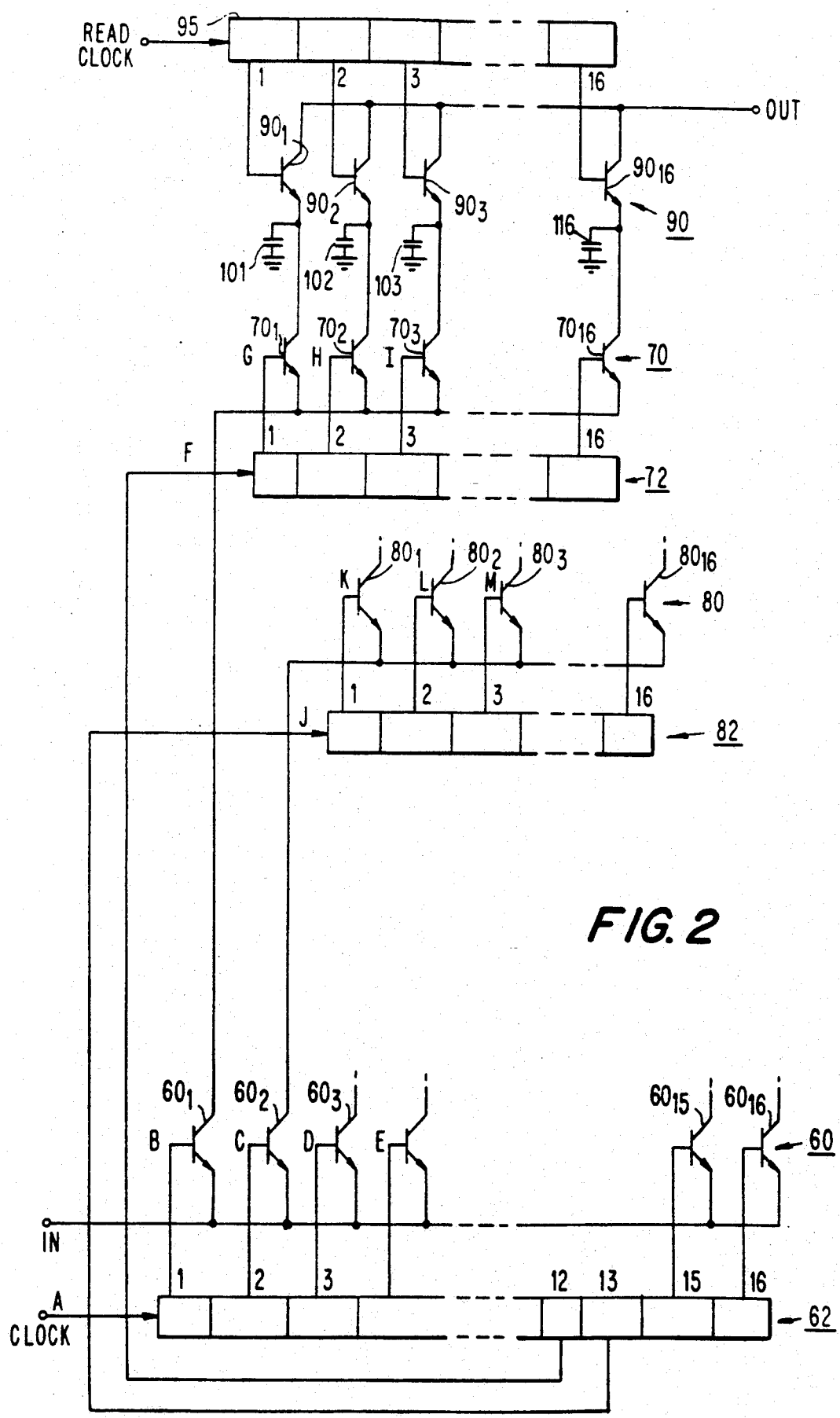
FIG. 2 is a schematic diagram of another embodiment of a switching tree for use with this invention.

Another embodiment of a high-speed sampling circuit is illustrated in FIG. 2. This embodiment is similar in many respects to the aforedescribed embodiment shown in FIG. 1 and may be fabricated on a single IC chip. In the FIG. 2 embodiment, the input set, or level, may be supplied with, for example, the samples produced by the intermediate set of the FIG. 1 embodiment. The input set of FIG. 2 is illustrated as being comprised of one sampling circuit 60, this sampling circuit being formed of, for example, sixteen individual switching devices $60_1$, $60_2$, $60_3$ ... $60_{16}$. Each of these switching devices may be similar to the aforedescribed switching devices employed in the embodiment of FIG. 1.

The inputs, or emitter electrodes, of switching devices $60_1$ ... $60_{16}$ are connected in common to receive an input signal, such as successive signal samples as mentioned above. Alternatively, the input signal may be an input current to be sampled and may be generated by a voltage-to-current converter similar to converter 10 of FIG. 1. Each switching device $60_1$ ... $60_{16}$ is actuated, or rendered conductive, in sequence. To this effect, a clock generator 62, illustrated herein as a 16-stage shift register, is coupled to the switching devices to supply respective phases of clock, or sample pulses thereto. Shift register 62 is coupled to a clock terminal to receive higher frequency clock pulses. It is appreciated that shift register 62 serves to divide the frequency of the input clock signal by the factor 16.

Each switching device $60_1$ ... $60_{16}$ included in input sampling circuit 60 is coupled to a respective sampling circuit included in the output set of sampling circuits. For brevity and simplification, only two of the sampling circuits 70 and 80 included in the output set are illustrated. Sampling circuit 70 is comprised of, for example, sixteen individual switching devices $70_1$, $70_2$, ... $70_{16}$. Likewise, sampling circuit 80 is comprised of, for example, sixteen individual switching devices $80_1$, $80_2$ ... $80_{16}$. It will be appreciated that the number of switching devices included in each sampling circuit illustrated in FIG. 2 may be any desired number. Furthermore, the number of switching devices included in input sampling circuit 60 need not necessarily be equal to the number of switching devices included in each sampling circuit of the output set.

The inputs, or emitter electrodes, of the switching devices included in each sampling circuit are coupled in common. As illustrated in FIG. 2, the common-connected input of sampling circuit 70 is coupled to the output of switching device $60_1$. The common-connected input of sampling circuit 80 is coupled to the output of switching device $60_2$. Thus, each output sampling circuit has its common-connected input coupled to a predetermined one of the switching devices included in input sampling circuit 60.

Switching devices $70_1$ ... $70_{16}$ are actuated, or rendered Conductive, in sequence, and at a frequency that is less than the frequency at which switching devices $60_1$ ... $60_{16}$ are actuated. Likewise, switching devices $80_1$ ... $80_{16}$ are actuated, or rendered conductive, in sequence and at the same frequency as switching devices $70_1$ ... $70_{16}$. However, the phases at which the switching devices included in sampling circuit 70 are actuated differ from the phases at which the switching devices included in sampling circuit 80 are actuated. Likewise, although not shown in FIG. 2, the switching circuits included in the remaining output sampling circuits are actuated, or rendered conductive, at the same frequency as the switching devices included in sampling circuit 70, but at different respective phases. In this regard, each output sampling circuit 70, 80, and so on, is associated with and coupled to a respective shift register 72, 82, etc. These shift registers are of similar construction and, for example, shift register 72 is comprised of a 16-stage shift register, each stage being coupled to the control terminal, or base electrode, of a respective switching device $70_1$ ... $70_{16}$. The input clock terminal of shift register 72 is coupled to a predetermined stage of shift register 62. Thus, shift register 72 serves to divide the frequency of the sampling pulses supplied thereto from shift register 62 by the factor 16, thereby producing respective phases (0°, 22.5°, 45°, and so on) of output sampling pulses. Accordingly, switching device $70_1$ is actuated at the 1 MHz rate at, for example, 0° phase, switching device $70_2$ is actuated at, for example, 22.5° phase, and so on.

Shift register 82 also is a 16-stage shift register; and the input clock terminal of shift register 82 is coupled to a different predetermined stage of shift register 62. Since shift registers 72 and 82 are supplied with pulses having different phases, it is appreciated that the sampling pulses produced by shift registers 72 and 82 also exhibit different phases with respect to each other. In the example illustrated in FIG. 2, the twelfth stage of shift register 62 is coupled to the input clock terminal of shift register 72 and the thirteenth stage of shift register 62 is coupled to the input clock terminal of shift register 82. If desired, shift registered 72 and 82 may be coupled to any other desired stages of shift register 62.

It will be appreciated that the embodiment of FIG. 2 overcomes the problem of slow response speed of the transistors due to high emitter capacitance. As in the FIG. 1 embodiment, the effective emitter capacitance is kept relatively low by forming groups of small numbers of emitter-connected transistors. Also, the frequencies of the sampling pulses are matched to the response speeds of the switching devices.

Preferably, the plural outputs of each output sampling circuit 70, 80 and so on, that is, the outputs of the respective switching devices included in such sampling circuits, are coupled to a temporary storage device. In the embodiment illustrated herein, the temporary storage device is an analog storage element, such as a capacitance element. A respective capacitance element 101, 102, 103, ... 116 is coupled to a respective output of the switching devices $70_1$, $70_2$, $70_3$ ... $70_{16}$ of output sampling circuit 70. The capacitance elements may be of conventional construction known to those of ordinary skill in the art and fabricated in accordance with conventional integrated circuit fabrication techniques. Although not illustrated in FIG. 2, it will be appreciated that similar capacitance elements are coupled to the outputs of sampling circuit 80, as well as to the outputs of the remaining sampling circuits included in the output set, or level.

A read-out circuit 90 is coupled to capacitance elements 101 ... 116; and although not shown, similar read-out circuits are coupled to the outputs of the remaining sampling circuits included in the output set, or level. Advantageously, read-out circuit 90 is comprised of individual switching devices $90_1$, $90_2$, ... $90_{16}$, each coupled to a corresponding one of capacitance elements 101, 102 ... 116. In the illustrated embodiment, each of the switching devices may be formed of a transistor element. In such a construction, the collector-emitter circuit of each transistor element comprises the read-out circuit, and the transistor element is actuated, or rendered conductive, in response to a read-out pulse supplied to the base electrode thereof. Hence, when a switching device, such as switching device $90_1$ is actuated, the charge stored across the capacitance element to which it is connected, such as capacitance element 101, causes a current to flow through the output circuit of that switching device. The magnitude of this current is, of course, a direct function of the charge stored across the capacitance element which, in turn, is determined by the magnitude of the signal sample that had been supplied to and stored on that capacitance element.

In the embodiment shown in FIG. 2, a read clock generator 95 is coupled to read-out circuit 90 to supply respective phases of the read-out pulses thereto. Read clock generator 95 preferably is a plural stage read-out shift register, with each stage thereof being coupled to a respective switching device $90_1$ ... $90_{16}$. A suitable source of read clock pulses (not shown) is coupled to the shift register, thereby actuating switching devices $90_1$ ... $90_{16}$ in sequence. An alternative source of read-out pulses is described below with respect to the embodiment illustrated in FIG. 5.

It should be appreciated that each read-out pulse that is provided at a respective stage of shift register 95 exhibits a duration sufficient to maintain its corresponding switching device $90_1$ ... $90_{16}$ conductive for a period of time that is adequate to fully read out, or discharge, the capacitance element connected thereto. Furthermore, the level of the read-out pulse supplied to the switching device is high enough to bring the voltage across the capacitance element to a predetermined reference voltage level once the charge stored thereon has been fully read out. For example, let it be assumed that switching device $90_1$ is a bi-polar transistor whose base electrode is supplied with the read-out pulse of sufficient duration and of a magnitude equal to approximately 4 volts. The voltage stored across capacitance element 101 is determined by the magnitude of the signal sample supplied thereto by switching device $70_1$. This stored voltage across capacitance element 101 may be represented as $V_1$, and this voltage is determined by the charge $Q_1$ supplied to the capacitance element divided by the capacitance $C_1$ thereof. Hence, $V_1 = Q_1/C_1$. For the moment, let it be assumed that the capacitance $C_1$ is a constant value.

Now, when switching device $90_1$ is actuated by the 4-volt read-out pulse, the usual base-emitter voltage drop of approximately 0.7 volts results in an emitter voltage on the order of 3.3 volts. The charge stored on capacitance element 101 now flows through the conductive switching device $90_1$ to generate a current therethrough having a magnitude determined by the magnitude of the stored charge. As the charge flows from capacitance element 101, the capacitance element is discharged such that the voltage $V_1$ thereacross increases toward the level of the voltage of the emitter of switching device $90_1$. It will be appreciated that this voltage increase is not instantaneous but, rather, is gradual over time. The magnitude of this voltage change $\Delta V$ is seen to be a function of the initial charge, or signal sample level, stored on the capacitance element. The quantity of charge which is read out from the capacitance element by switching device $90_1$ may be expressed as $Q_{OUT} = \Delta V\ C_1 = (3.3 - V_1)\ C_1$.

The quantity of the read out charge, which represents the input signal sample level, may be converted to a digital signal by a conventional A/D converter. Preferably, a precise integrating capacitor may be provided to receive the read out charge sample and thereby convert that charge to a corresponding potential level which, in turn, is digitized.

It will be appreciated that the duration of the read-out pulse is sufficient such that, at its conclusion, most if not all of the charge stored on, for example, capacitance element 101 will have been read out and, moreover, the voltage level now present across this capacitance element will be substantially equal to the reference voltage level. As a numerical example, if the read-out pulse magnitude is on the order of about 4 volts, the reference voltage level to which capacitance element 101 is reset is on the order of about 3.3 volts. In practice, the actual reference voltage level may be somewhat less than this 3.3 volt level due to, for example, the base-emitter capacitance of transistor element $90_1$, and other factors. Nevertheless, for a read-out pulse magnitude of about 4 volts, the reference voltage level to which capacitance element 101 is reset may be expected to be about 3.3 volts.

It is understood that the remaining capacitance elements are read out and reset by remaining switching devices $90_2$ ... $90_{16}$ in a substantially similar manner.

After all of the capacitance elements have been read out and thus reset, they are prepared to receive and store another set of signal samples. If desired, immediately prior to the storage, or writing in, of a signal sample to a particular capacitance element, the read-out switching device coupled to the capacitance element may be actuated to insure that the capacitance element is reset accurately to the aforementioned reference voltage level. This also will be explained below.

The timing diagrams illustrated in FIGS. 4A-4M represent the sequential sampling operations carried out by the input set of sampling circuits 60 and the output set of sampling circuits 70, 80 and so on. FIG. 4A represents the high frequency clock pulses supplied to shift register 62. Each clock pulse (FIG. 4A) triggers shift register 62 to shift a pulse from one stage therein to the next adjacent stage. FIGS. 4B-4F represent the sampling pulses provided at the outputs of, for example, the first, second, third, fourth and twelfth stages of shift register 62.

Since shift register 62 is assumed herein to be, for example, a 16-stage shift register, it will be appreciated that the sampling pulse provided at the output of a respective stage thereof exhibits a frequency that is one-sixteenth the frequency of the input clock pulses. Each sampling pulse actuates a respective switching device $60_1 \ldots 60_{16}$ coupled thereto. The cross-hatched areas shown in FIGS. 4B–4F represent the actuation of such switching devices and, thus, these cross-hatched areas represent the respective, sequential samples of the input signal.

As shown in FIG. 2, the input signal is supplied in common to the inputs, or emitter electrodes, of switching devices $60_1 \ldots 60_{16}$. Preferably, the input signal is an input current which may be generated by a voltage-to-current converter similar to converter 10 described above with respect to FIG. 1. Thus, when each switching device $60_1 \ldots 60_{16}$ is rendered conductive, an input current sample flows therethrough.

Each of shift registers 72, 82, . . ., is coupled to a respective stage of shift register 62. Hence, the sampling pulses produced at the output of that respective stage serve to shift a pulse from one stage to the next adjacent stage in the shift register coupled thereto. For example, and as shown in FIG. 2, the twelfth stage of shift register 62 is coupled to the clock input of shift register 72. Thus, every sampling pulse provided at the output of the twelfth stage of shift register 62 triggers shift register 72 to propagate a pulse therethrough. The output of the twelfth stage of shift register 62 is illustrated in FIG. 4F, and FIGS. 4G–4I represent the pulse which is propagated through the first, second and third stages of shift register 72 in response to the pulses of FIG. 4F. Since shift register 72 is assumed to be a 16-stage shift register, it functions to divide the frequency of the sampling pulses supplied thereto from the twelfth stage of shift register 62 by the factor 16. The cross-hatched areas in FIGS. 4G–4I represent the input signal sample supplied to sampling circuit 70 by switching device $60_1$, which sample is transferred sequentially by switching devices $70_1$, $70_2$, $70_3$, and so on. Thus, although a switching device included in sampling circuit 70 is rendered conductive for a moderate duration, the fact that switching device $60_1$ had been rendered conductive for an even shorter duration means that the duration of the sample which is transferred through switching device $70_1$ is equal to that shorter duration. Moreover, it is preferred that the input signal sample be transferred through switching device $70_1$ after the latter has been actuated for some period of time. It is for this reason that shift register 72 is driven by the sampling pulses derived from, for example, the twelfth stage of shift register 62 rather than from the fifteenth, sixteenth, first or second stages thereof. If desired, shift register 72 may be driven by the sampling pulses derived from any other stage of shift register 62, such as a stage from the third to the fourteenth stages.

Similarly, shift register 82 is driven from the sampling pulses derived from the thirteenth stage of shift register 62, such sampling pulses being illustrated in FIG. 4J. FIGS. 4K–4M illustrate the sequential sampling pulses that are provided at the first, second and third stages of shift register 82. Since sampling circuit 80, which is driven by shift register 82, is coupled to the output of switching device $60_2$, it is appreciated that an input signal sample produced by switching device $60_2$ is transferred through the particular switching device included in sampling circuit 80 that is rendered conductive. This is represented by the cross-hatched areas of FIGS. 4K–4M.

It is recognized that switching devices $60_1 \ldots 60_{16}$, included in the input sampling circuit 60, are actuated in sequence (FIGS. 4B–4F). The first input signal sample is produced by, for example, switching device $60_1$, and this sample is coupled to sampling circuit 70 and transferred to, for example, capacitance element 101 by switching device $70_1$ (FIG. 4G). The next input signal sample is produced by switching device $60_2$, and this sample is coupled to sampling circuit 80 whereat it is transferred to a capacitance element by, for example, switching device $80_1$ (FIG. 4K). The next-following sample is produced by switching device $60_3$, and this sample is coupled to another output sampling circuit (not shown) whereat it is transferred to a capacitance element by, for example, the first switching device included in that sampling circuit. This sequence continues until switching device $60_1$ is actuated once again. Then, the sample produced by this switching device is transferred by switching device $70_2$ to capacitance element 102. Then, switching device $60_2$ is actuated once again, and the sample produced by this switching device is transferred to a capacitance element (not shown) by the second switching device $80_2$ included in sampling circuit 80. As the next switching devices $60_3 \ldots 60_{16}$ are actuated in sequence, the second switching device included in each of the remaining output sampling circuits serves to transfer the successive input signal samples to respective capacitance elements.

After switching device $60_{16}$ is actuated, switching device $60_1$ is actuated once again. At this time, the third switching device $70_3$ included in output sampling circuit 70 is rendered conductive. Hence, the sample produced by switching device $60_1$ now is transferred to capacitance element 103 by this third switching device $70_3$. Thereafter, switching device $60_2$ is actuated to couple the sample produced thereby to sampling circuit 80. This sample is transferred by the third switching device $80_3$ included in sampling circuit 80 to the capacitance element (not shown) connected thereto. Then, as the remaining switching devices $60_3 \ldots 60_{16}$ are actuated in sequence, each of the third switching devices included in the remaining output sampling circuits is actuated to transfer the sample supplied thereto to a respective capacitance element.

From the foregoing description, it is readily seen that the first switching device included in each of the output sampling circuits 70, 80, . . ., is rendered conductive, in sequence, to transfer the samples supplied sequentially thereto by the first sampling circuit 60. Then, each of the second switching devices included in the output sampling circuits is rendered conductive in sequence, and then each of the third switching devices is rendered conductive in sequence, and so on. Although the input clock pulses (FIG. 4A) are generated at a fast rate, thus sampling the input signal at this fast rate, the output switching devices included in each of the output sampling circuits are actuated, or turned ON, at a much lower rate. This rate is sufficiently low to assure that each storage capacitance element is reset prior to being charged with a signal sample and, furthermore, to be charged accurately with that signal sample.

It is further seen that the writing in of samples to the capacitance elements and the reading out of such samples therefrom may be carried out independently. Thus, the read-out rate may be less than the write-in rate, if desired. Furthermore, to avoid interference between signal samples that might be written onto the capacitance elements during a read-out operation, it is preferred that the aforedescribed sampling operation be inhibited during the read-out operation. For example, a reference level, such as a relatively higher potential level, may be supplied to the common-connected inputs, or emitter electrodes, of the switching devices included in input sampling circuit 60. Alternatively, this reference level may be supplied to the common-connected inputs, or emitter electrodes, of the switching devices included in each of the output sampling circuits 70, 80 and so on. Suitable circuitry (not shown) may be employed for this purpose.

Although not shown in FIG. 2, it may be appreciated that the read-out circuit coupled to each output sampling circuit, such as read-out circuit 90, may have its output terminal coupled to a buffer amplifier, such as a transistor. The output from each such buffer amplifier then may be connected in common to a single output terminal to which a conventional digitizing circuit may be connected. Such fanning in, or multiplexing, of the outputs from each of the read-out circuits reduces the capacitance provided at the output circuit which, in turn, enables a high response speed. Also, advantageously this minimizes the number of output pins that may be required if the sampling apparatus is constructed as an integrated circuit.

Figure 5:
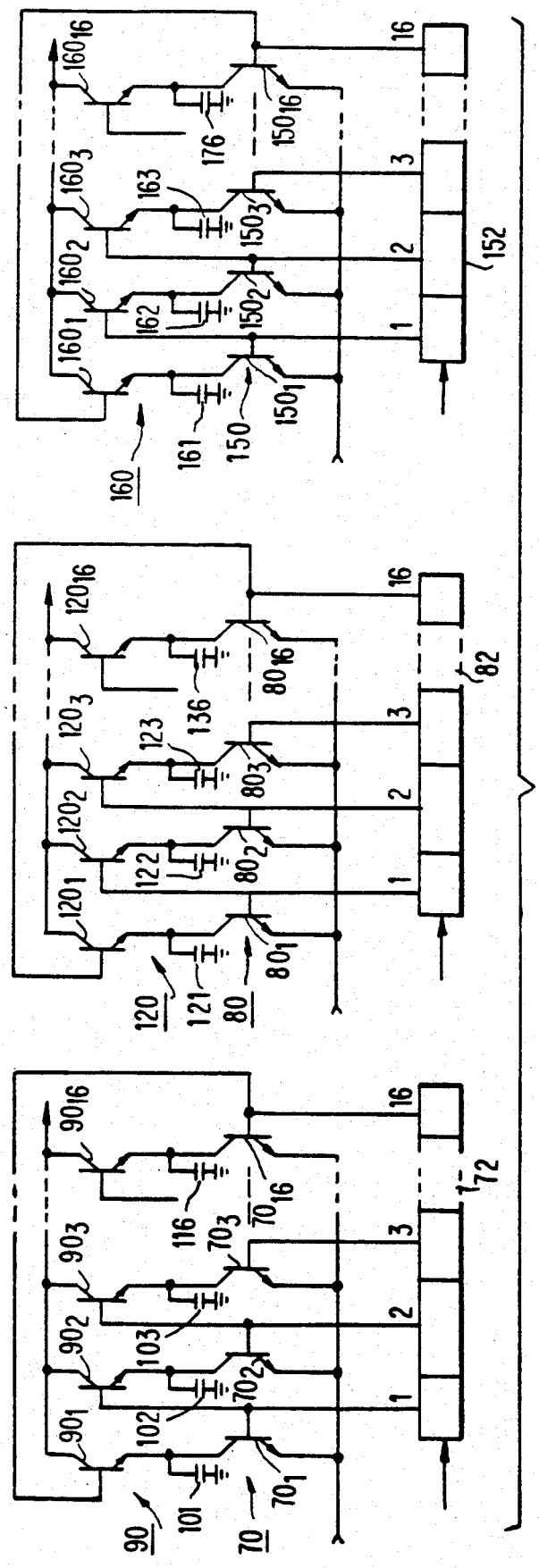
FIG. 5 is a schematic diagram of a portion of the embodiment shown in FIG. 2.

A portion of the embodiment shown in FIG. 2 is re-drawn in FIG. 5. In particular, FIG. 5 illustrates the output set, or level, of sampling circuits 70, 80, . . . 150, each of these sampling circuits being coupled to the plural stages of a respective shift register 72, 82, . . . 152. As discussed above, each sampling circuit is comprised of plural switching devices, illustrated herein as transistor elements, and each switching device is coupled to a respective stage of its associated shift register to be actuated in response to a pulse shifted into that stage. FIG. 5 also illustrates the analog storage devices, shown as capacitance elements, coupled to the outputs of each sampling circuit. Thus, the outputs of sampling circuit 70 are coupled to capacitance elements 101, 102, . . . 116; the outputs of sampling circuit 80 are coupled to capacitance elements 121, 122, . . . 136; and so on, with the outputs of sampling circuit 150 being coupled to capacitance elements 161, 162, . . . 176.

FIG. 5 also illustrates the switching devices which are coupled to the capacitance elements for the dual purpose of resetting and reading out those capacitance elements. As shown, switching devices $90_1, 90_2 \ldots 90_{16}$ are coupled to capacitance elements 101, 102, . . . 116, respectively; switching devices $120_1, 120_2, \ldots 120_{16}$ are coupled to capacitance elements 121, 122, . . . 136, respectively; and switching devices $160_1, 160_2, \ldots 160_{16}$ are coupled to capacitance elements 161, 162, . . . 176, respectively. In the embodiment described above with respect to FIG. 2, these switching devices are coupled to a separate read out shift register 95. In the embodiment illustrated in FIG. 5, the switching devices are coupled to the very same shift register as are the switching devices included in the respective sampling circuits. Thus, switching devices 90 are coupled to the respective stages of shift register 72, switching devices 120 are coupled to the respective stages of shift register 82 and switching devices 160 are coupled to the respective stages of shift register 152. As illustrated, a respective stage of a shift register, such as the first stage of shift register 72, is coupled to a switching device included in the sampling circuit such as switching device $70_1$, and also to the next-following switching device included in the reset/read-out circuit, such as switching device $90_2$. That is, the first stage of the shift register is coupled to the first switching device included in the output sampling circuit and to the second switching device included in the reset/read-out circuit. The second stage of the shift register is coupled to the second switching device included in the output sampling circuit and also to the third switching device included in the reset/read-out circuit. Similar connections are made for the remaining switching devices, and as illustrated, the last stage of the shift register is coupled to the last switching device included in the output sampling circuit and also to the first switching device included in the reset/read-out circuit. Hence, when a pulse is shifted into a particular stage of the shift register, an input signal sample is written into one capacitance element and the next-following capacitance element is reset to a predetermined reference level.

The manner in which a capacitance element first is reset and then is charged to a level determined by an input signal sample written thereon is illustrated by the waveform diagrams shown in FIGS. 6A–6E. For convenience, these waveform diagrams are separated into write and read cycles. The present discussion is concerned with the write cycle whereby the capacitance elements are charged with input signal samples.

Figure 6:
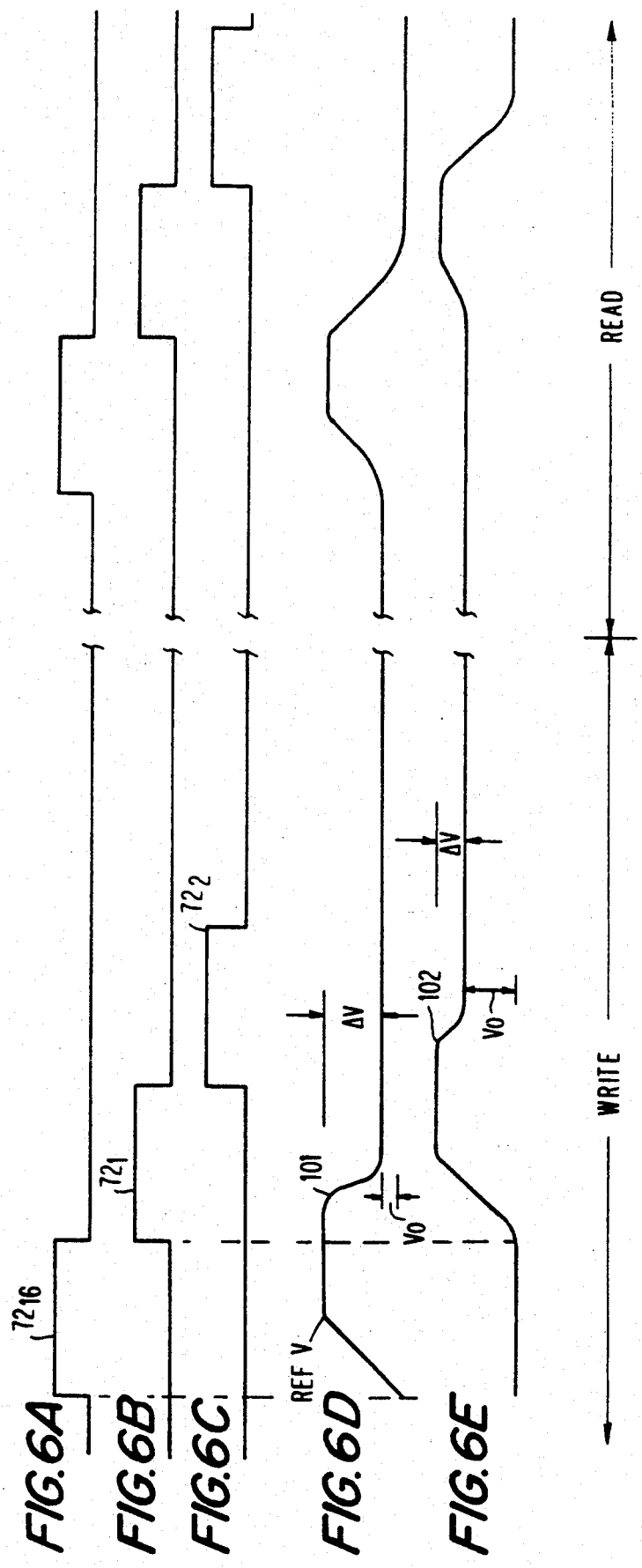
FIGS. 6A-6E are waveform diagrams which are useful in understanding the manner in which samples are written into and read out of storage elements in the embodiment of FIG. 5.

FIGS. 6A–6C illustrate the sampling pulses produced at the sixteenth, first and second stages, respectively, of shift register 72. As shown in FIG. 6D, the sampling pulse provided at the sixteenth stage of shift register 72 is supplied as a reset pulse to switching device $90_1$, whereupon the voltage at the emitter electrode thereof charges capacitance element 101 from whatever level then is stored thereon. As shown in FIG. 6D, the voltage across capacitance element 101 now is charged to the reference potential REF V. As an example, and as described above, if the voltage magnitude of the reset pulse supplied to switching device $90_1$ is on the order of about 4 volts, then, because of the 0.7 volts base-emitter voltage drop, the voltage at the emitter electrode of switching device $90_1$ is about 3.3 volts. Hence, and as shown in FIG. 6D, the voltage across capacitance element 101 is charged to this reference voltage level of 3.3 volts.

As shown in FIGS. 6A and 6B, at the conclusion of the reset pulse produced at the sixteenth stage of shift register 72, a sampling pulse is produced at the first stage thereof. This sampling pulse is supplied to switching device $70_1$; and as is recalled from FIG. 4G, an input signal sample is coupled to switching device $70_1$ during this duration. This input signal sample is transferred by switching device $70_1$ to capacitance element 101. In the preferred embodiment, the signal sample is a current sample; and this current sample now charges the capacitance element to a corresponding level. Thus, the voltage across capacitance element 101 is reduced from its reset, or reference voltage level to a voltage level determined by the quantity of charge transferred thereto. As illustrated in FIG. 6D, this writing in of a current sample to capacitance element 101 decreases the voltage thereacross by $\Delta V$. This new voltage level (REF $V - \Delta V$) is stored across capacitance element 101 until read out therefrom, as will be described below.

As shown in FIG. 6E, the sampling pulse which is produced at the first stage of shift register 72 serves to actuate switching device $90_2$ so as to reset the next-following capacitance element 102. Thus, while capacitance element 101 is charged with a current sample, that is, during the write-in operation, the next-following capacitance element is reset to the reference voltage level. Thereafter, the sampling pulse produced by the first stage of shift register 72 terminates and the second stage thereof now produces the sampling pulse shown in FIG. 6C. As a result of this next-following sampling pulse, switching device $70_2$ is actuated to charge capacitance element 102 with the current sample now transferred through this switching device. Hence, the voltage across capacitance element 102 is reduced by the amount $\Delta V$, as illustrated. The voltage now stored across capacitance element 102 (REF $V-\Delta V$) remains thereon until read out.

It is appreciated that the voltage across the capacitance element is determined by the quantity of charge transferred thereto and is independent of the voltage-dependent characteristics of the capacitor. That is, some capacitive devices, and particularly those formed by semiconductor junctions, are known to exhibit capacitance levels which are affected by the voltage stored thereacross. Hence, as the stored voltage changes, the capacitance also changes, thereby affecting the accuracy with which the stored voltage may be measured. However, since charge is supplied to the capacitance element in the embodiment described herein, any changes in the capacitance because of the voltage thereacross will, nevertheless, not affect the quantity of charge which has been supplied thereto. Furthermore, since all of the stored charge is read out, and since this read out charge subsequently is converted to an analog voltage level by a precise capacitance device, there is no undue influence on the charge because of the voltage-dependent characteristics of the capacitance element. Accordingly, by using charge samples, errors in the signals read out from voltage-dependent capacitance elements are avoided.

The read cycle is similar to the aforedescribed write cycle, except that, if desired, the frequency of the read pulses generated by the shift registers may be reduced from the frequency of the sampling (reset) pulses. When the sixteenth stage, for example, of shift register 72 produces a read pulse, as shown in FIG. 6A, switching device $90_1$ is actuated. Accordingly, the voltage produced at the emitter thereof is increased to the reference voltage level REF V, as shown in FIG. 6D. The magnitude $\Delta V$ by which the voltage across capacitance element 101 changes is a function of the amount of charge stored thereon. Thus, as the capacitance element is discharged, the charge which had been stored thereacross is read out. As mentioned above, the current produced by reading out the charge stored across capacitance element 101 is integrated by a precise integrator and then digitized. In particular, switching device $90_1$ provides a current path from capacitance element 101 to the illustrated output terminal.

The read-out pulse produced by the first stage of shift register 72 also actuates switching device $90_2$ to read out the charge stored across capacitance element 102, as illustrated in FIG. 6E. Hence, the voltage across this capacitance element now is increased by the amount $\Delta V$ to the reference voltage level REF V.

As read-out pulses are produced sequentially by shift register 72, capacitance elements 101, 102 . . . 116 are read out in sequence in the manner described above. Likewise, as shift register 82 produces sequential read-out pulses, capacitance elements 121, 122, . . . 136 are read out in sequence. Thus, depending upon the frequency of the read-out pulses, the stored charges are read out from the capacitance elements and, as such stored charges are read, the capacitance elements are thereby reset.

Figure 7:
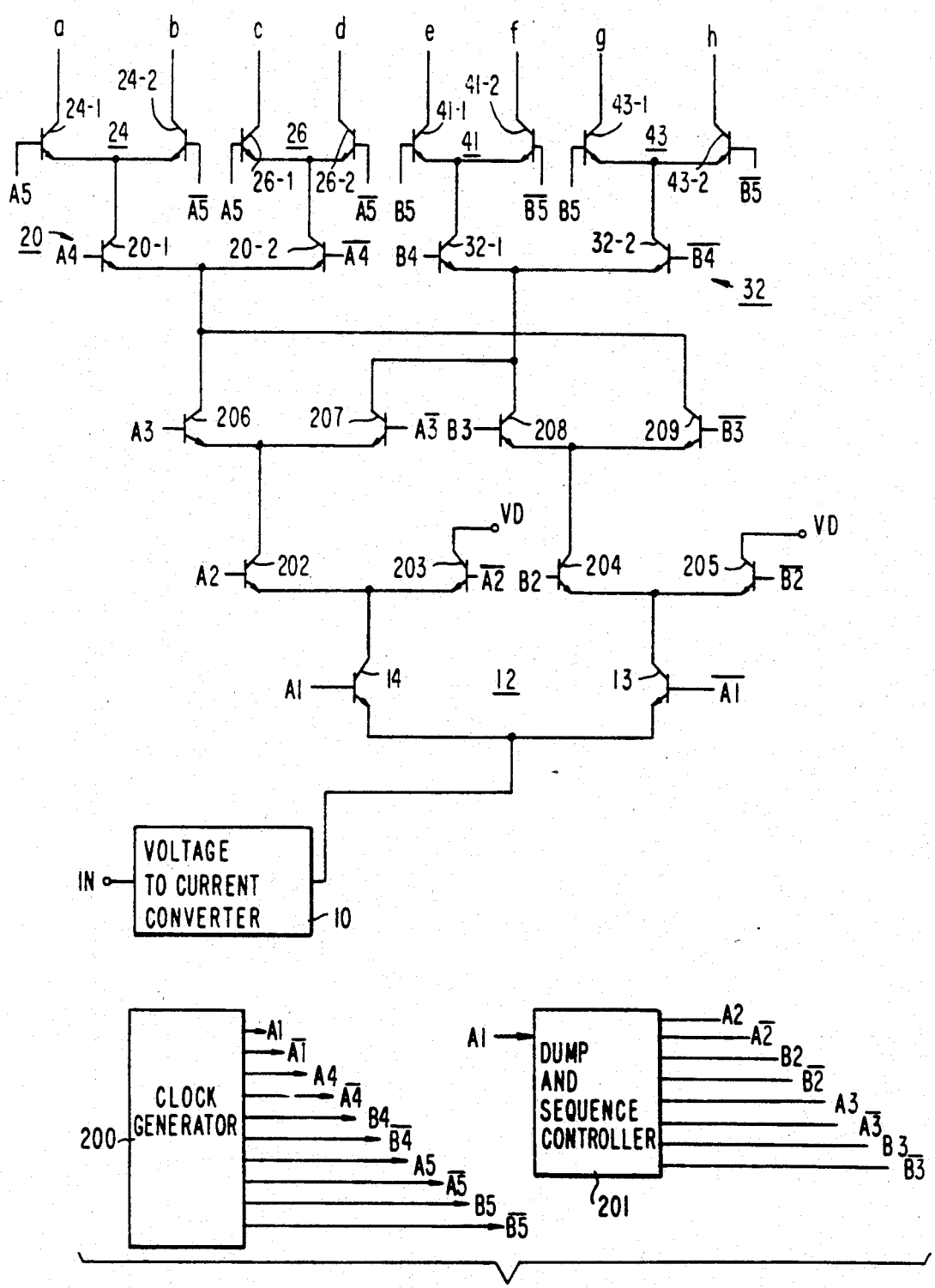
FIG. 7 is a schematic diagram illustrating one embodiment of the present invention.

Turning now to one aspect of the present invention, FIG. 7 is a schematic illustration of one embodiment of a high-speed sampling apparatus of the type described above in conjunction with FIG. 1, which further includes circuitry to allow for the reduction of the effective sampling frequency of the input signal without requiring that the speed of the primary clock source be reduced. Thus, the sampling frequency may be reduced selectively, and as desired, thereby permitting the high-speed sampling apparatus to be used with input signals whose frequency components do not warrant the aforementioned high speeds, without changing or modifying the apparatus. It will be seen that this expands the utility and flexibility of the sampling apparatus and does not call for the user to purchase several pieces of equipment to perform similar functions at different speeds. The illustrated apparatus includes voltage to current converter 10, a clock generator 200, and plural cascaded sets, or levels, of sampling circuits including input set 12, an output set including sampling circuits 24, 26, 41 and 43 and an intermediate set comprised of sampling circuits 20 and 32. These sampling circuits correspond to those identified by the same reference numerals as shown in FIG. 1; however, for simplicity, the apparatus shown in FIG. 7 limits each sampling circuit to include two outputs only. In such an implementation, sampling pulse sources 18, 19, 22, 23, 31 and 33 of FIG. 1 may be implemented by flip-flop circuits, similar to flip-flop circuit 16, which may be thought of as a single stage shift register rather than by plural-stage shift registers. Thus, the two switching elements which comprise each sampling circuit may be controlled by complementary sampling pulses (i.e., clock signals). In particular, in FIG. 7 all of the aforementioned sampling pulse sources are shown consolidated as clock generator 200.

In addition to voltage to current converter 10, clock generator 200, and the aforementioned sets of sampling circuits, the illustrated apparatus includes a dump and sequence controller 201, dump elements 203 and 205, pass elements 202 and 204, and sequencing elements 206, 207, 208 and 209. In one embodiment, these dump elements, pass elements and sequencing elements are comprised of transistor devices, such as bi-polar transistors, as are the switching elements which comprise the sampling circuits. Alternatively, the dump elements, pass elements and sequencing elements may be MOS transistors. It will be appreciated by those of ordinary skill in the art that other types of transistor devices which are capable of operating at high switching frequencies may be used; and, moreover, these elements need not be limited solely to transistor devices. In the interest of brevity and simplification, it is assumed, for the purpose of discussion, that all of the aforementioned switching elements are formed of transistor switching devices which, advantageously, may be fabricated as an integrated circuit chip.

In the illustrated embodiment, dump transistors 203 and 205 are coupled to corresponding outputs of input sampling circuit 12 and are adapted to dump current out of the sampling apparatus and, thus, divert such current away from sampling circuits 20, 32, at predetermined sampling times so as to reduce the effective frequency at which the input current is sampled and supplied to further circuitry (such as the aforementioned read-out circuitry). In particular, dump transistor 203 is coupled to transistor 14 of input sampling circuit 12, and dump transistor 205 is coupled to transistor 13 of input sampling circuit 12. When one of these dump transistors is activated, any current being switched through the corresponding output of the input sampling circuit connected thereto is diverted out of the network through the dump transistor and a dump output $V_D$. For example, when pass signal A2 supplied to pass transistor 202 by dump and sequence controller 201 admits of a low level and complementary dump signal A2* supplied to dump transistor 203, is of a high level, any current passed through transistor 14 of input sampling circuit 12 is dumped from the network to dump output $V_D$, and thus will not be further sampled by the succeeding levels of sampling circuits. Similarly, when pass signal B2 produced by the dump and sequence controller is low and complementary dump signal B2* supplied to dump transistor 205 is high, any current passed through transistor 13 of input sampling circuit 12 is dumped from the network to dump output $V_D$, and thus will not be further sampled by the succeeding levels of sampling circuits. In this manner, sampling may be effectively inhibited at selected sampling times, thus reducing the effective sampling frequency of the network, while maintaining the speed of the primary clock source.

Pass transistors 202 and 204 are coupled in common with dump transistors 203 and 205 to corresponding outputs of input sampling circuit 12 and are adapted to pass current samples from the input sampling circuit to intermediate level sampling circuits 20 and 32, respectively, whenever those current samples are not being dumped by dump transistors 203 and 205, respectively. In particular, the control input, or base, of pass transistor 202 is supplied with pass signal A2, which is complementary to dump signal A2*, and similarly, the control input, or base, of pass transistor 204 is supplied with pass signal B2, which is complementary to dump signal B2*. Thus, whenever a current sample is being dumped, a pass transistor is rendered non-conductive and the current is properly shut off from passing therethrough to the next level of sampling circuits. Otherwise, current is appropriately passed by pass transistors 202 and 204.

Sequencing transistors 206, 207, 208 and 209 are coupled in pairs to respective ones of pass transistors 202 and 204, and are adapted to switch a current passed by the pass transistors to a selected one of intermediate sampling circuits 20 and 32. In particular, sequencing transistors 206 and 207 are coupled to pass transistor 202 and supply current samples to intermediate sampling circuits 20 and 32, respectively. Sequencing transistors 206 and 207 have their control inputs, or bases, supplied with complementary sequence signals A3 and A3*, respectively, produced by dump and sequence controller 201. Hence, any current which is supplied by pass transistor 202 is switched to one of sampling circuits 20 and 32, depending upon the state (or level) of sequence signal A3. Similarly, sequencing transistors 208 and 209 are coupled to pass transistor 204, and supply circuit samples to intermediate sampling circuits 32 and 20, respectively. Sequencing transistors 208 and 209 have their control inputs, or bases, supplied with complementary sequence signals B3 and B3*, respectively, produced by the dump and sequence controller. Current which is supplied by pass transistor 204 is switched to one of sampling circuits 32 and 20, depending upon the state (or level) of sequence signal B3.

The purpose of the sequencing transistors is to provide for more efficient usage of the high-speed sampling apparatus circuitry when the effective sampling speed has been reduced. In particular, and as described above, when sampling is being performed at the full clock speed of the primary clock source (i.e., when no current samples are being dumped by dump transistors 203 and 205), each of the transistors in each of the sampling circuits in the output level, namely, each transistor in sampling circuits 24, 26, 41 and 43 in FIG. 7, passes a current sample in turn, that is, in predetermined order. Thus, all read-out circuits are used. That is, all A/D converters 40 (see FIG. 1) provide analog to digital conversion of the signals coupled to each of their respective inputs (in order), or all capacitance elements 101, 102, ... (see FIG. 2) provide storage of all current samples supplied thereto (in order). However, when certain samples are not passed through the sampling network, but, rather, are dumped as aforementioned, some of the elements in these read-out circuits may not perform their intended functions, since it may be that the samples not passed include those which would otherwise be processed (i.e., converted and/or stored) by these elements. For example, if every other sample is dumped by setting pass signal A2 high and pass signal B2 low, only those current samples which are switched through transistor 14 of input sampling circuit 12 are passed to the intermediate level of sampling circuits, while all those current samples switched through transistor 13 are dumped. However, were it not for sequencing transistors 206, 207, 208 and 209 (i.e., if pass transistor 202 were to supply current samples directly to sampling circuit 20 and pass transistor 204 were to supply current samples directly to sampling circuit 32), intermediate level sampling circuit 32, and, therefore output level sampling circuits 41 and 43 would never receive, and therefore never pass any current samples for further processing. Thus, the A/D converters or the capacitance elements supplied by these output level sampling circuits would not perform their intended functions. In particular, if the samples are to be stored, the reduction in effective sampling frequency by a factor of two would result in only half as many samples being stored at one time. To overcome this inefficiency and to make full use of the available circuit resources, sequencing transistors 206, 207, 208 and 209 are used in combination with dump transistors 203 and 205 to provide for a reduction in the effective sampling frequency without any reduction in sample storage capacity.

Clock generator 200 is adapted to supply a set of sampling pulses (clock signals) to sampling circuits 12, 20, 32, 24, 26, 41 and 43, and is comprised of a reference oscillator, such as a crystal oscillator, which provides a high-speed clock source of a very stable frequency at least as high as the highest sampling frequency of the sampling circuits (i.e., at least as high as the primary clock source which supplies sampling clock pulses to the input level), and frequency dividing circuitry to generate the sampling pulse signals to be supplied to each of the respective succeeding sampling circuits. Since each sampling circuit in the embodiment illustrated in FIG. 7 is comprised of only two outputs, clock generator 200 produces sampling pulse signals in complementary pairs having opposite logic values, such as A1, A1* supplied to sampling circuit 12, A4, A4* supplied to sampling circuit 20, B4, B4* supplied to sampling circuit 32, and so on. It is to be appreciated that signal sets comprised of more than two sampling pulse signals, only one of which is active at a time in a set, may be advantageously supplied where sampling circuits with more than two outputs are used. Such an extension to the illustrated apparatus will be obvious to one of ordinary skill in the art.

Dump and sequence controller 201 is adapted to supply a set of control signals to control the operation of dump transistors 203 and 205, pass transistors 202 and 204, and sequencing transistors 206, 207, 208 and 209, respectively. Depending on the user-selectable mode in which the sampling apparatus is to operate (e.g., the effective sampling frequency to be achieved), the dump and sequence controller supplies signals which control the states of the dump transistors, pass transistors and sequencing transistors to be active (conducting) or inactive, or periodically switched between the active and inactive states, depending upon the waveform of the appropriate controlling signal supplied to these transistors. When a periodic waveform is supplied by dump and sequence controller 201, it is generated in synchronism with sampling clock pulse A1. In this manner, the operation of the dump transistors, pass transistors and sequencing transistors may be properly synchronized to the sampling operation of the sampling circuits.

In the illustrated embodiment, all output signals from dump and sequence controller 201 are supplied in complementary pairs of signals having opposite logic values. It is to be appreciated that the dump and pass transistors are provided in pairs and the complementary signal pairs will activate one dump transistor or one pass transistor at a time. However, when controlling sequencing transistors 206, 207, 208 and 209, signal sets comprised of more than two signals, only one of which is active at a time, may be advantageously supplied where the sequencing circuit is used to selectively switch a current sample from an output of a sampling circuit at one level to one of more than two sampling circuits at the next level. For simplicity and ease of understanding, the sequencing circuits of the illustrated embodiment switch current samples to one of only two sampling circuits, and, therefore, complementary pairs of sequence control signals are sufficient.

The operation of the high-speed sampling apparatus as illustrated in FIG. 7 can best be appreciated with reference to the waveforms of FIGS. 8A–8C, which illustrate three of the possible operating modes of the sampling apparatus. FIG. 8A shows the control signals applied by clock generator 200 and dump and sequence generator 201 for full speed operation of the apparatus. In this mode, no current samples are dumped and sequencing transistors 206, 207, 208 and 209 serve only to pass current samples from each of the respective outputs of input sampling circuit 12 to a corresponding, constant one of intermediate level sampling circuits 20 and 32, respectively. In particular, pass control signals A2 and B2 produced by dump and sequence controller 201 are fixed at logic high levels, and, therefore, dump transistors 203 and 205 are inhibited from dumping current samples produced by input sampling circuit 12, while pass transistors 202 and 204 are enabled to pass current from transistors 14 and 13, respectively, to intermediate level sampling circuits 20 and 32.

In addition, sequence control signals A3 and B3 are fixed at logic high levels, and, therefore, sequencing transistors 206 and 208 are enabled to pass current to intermediate sampling circuits 20 and 32, respectively, while sequencing transistors 207 and 209 are inhibited. Thus, the illustrated network operates as if dump transistors 203 and 205, pass transistors 202 and 204, and sequencing transistors 206, 207, 208 and 209 are not present, and as if intermediate level sampling circuit 20 is connected directly to transistor 14 of input sampling circuit 12, and intermediate level sampling circuit 32 is connected directly to transistor 13 of input sampling circuit 12, as described above.

In particular, the sampling pulse signal A1 and its complement A1* control transistors 14 and 13 of input sampling circuit 12, respectively, such that alternate current samples are passed therethrough and supplied to intermediate level sampling circuits 20 and 32, respectively. Sampling pulse signals A4, A4* and B4, B4* (shown in FIGS. 8Avi and 8Avii) generated by clock generator 200 have frequencies equal to one half of sampling pulse signal A1 and control the conductive states of transistors 20-1 and 20-2 of intermediate level sampling circuit 20, and transistors 32-1 and 32-2 of intermediate level sampling circuit 32, respectively. In this manner, alternate current samples received by intermediate level sampling circuit 20 are passed to output level sampling circuit 24 and output level sampling circuit 26, and, similarly, alternate current samples received by intermediate level sampling circuit 32 are passed to output level sampling circuit 41 and output level sampling circuit 43. Thus, successive current samples are switched to network outputs h,d,f,b,g,c,e and a, by sampling pulse signals A5, A5* and B5, B5* (FIGS. 8Aviii and 8Aix) in the repetitive sequence illustrated in FIG. 8Ax for A/D conversion or storage as discussed above.

FIG. 8B illustrates one example for operating with an effective sampling frequency of one half that of the sampling pulse signal. Pass signal A2 is supplied at a fixed high logic level while complementary signal A2* is at a low level, thereby inhibiting dump transistor 203 from dumping current samples produced by transistor 14. However, pass signal B2 is fixed at a low logic level by dump and sequence controller 201 while complementary signal B2* remains high such that all current samples produced by transistor 13 of input sampling circuit 12 are dumped by dump transistor 205. Therefore, every other current sample is dumped, thereby reducing the effective sampling frequency of the illustrated network by one half.

Signal A3 and its complement A3*, which control sequencing transistors 206 and 207, provide for the distribution of the passed current samples to the intermediate level sampling circuits. In the example shown in FIG. 8Biv, these signals are supplied by dump and sequence controller 201 with a frequency equal to one half that of the sampling pulse signal A1 and, therefore, alternate current samples which are passed by pass transistor 202 are coupled to intermediate level sampling circuits 20 and 32, respectively. It is to be appreciated that if sequencing transistors 206 and 207 are not included in the circuit (i.e., if pass transistor 202 is directly connected to intermediate level sampling circuit 20), or if signal A3 is to remain high, as in FIG. 8Aiv, all current samples will pass through intermediate level sampling circuit 20 to output level sampling circuits 24 and 26 only, because current samples produced by transistor 13 are diverted away from intermediate level sampling circuit 32 by dump transistor 205. As a result, only network outputs a, b, c and d will receive current samples, and if samples are stored by output capacitance elements, one half of the total network storage capacity will be wasted.

The use of the sequencing transistors, however, directs current samples to all network outputs a-h, as shown in FIG. 8Bx, albeit at one half the effective sampling rate. In particular, in order to ensure that each network output does, in fact, receive current samples, sampling pulse signals A4 and B4 (FIGS. 8Bvi and 8Bvii), along with their respective complementary signals A4* and B4*, are supplied by clock generator 200 to the control inputs of intermediate level sampling circuit transistors 20-1, 32-1, 20-2 and 32-2 with a frequency equal to one fourth that of the sampling pulse signal, A1, as opposed to a frequency of one-half that of A1 as shown in FIGS. 8Avi and 8Avii. Furthermore, sampling pulse signals A5 and B5, along with their respective complementary signals A5* and B5* are supplied to the control inputs to the output sampling circuit transistors by the clock generator with a frequency equal to one eighth that of the sampling pulse signal, A1 (FIGS. 8Bvii and 8Bix). It is appreciated that since the intermediate and output levels of sampling circuits are supplied with sampling pulses at one half the frequency that sampling pulses normally are supplied thereto during full speed operation and since current samples likewise are coupled from the preceding level at half the normal full speed, the overall, effective operating speed of the sampling network is reduced without changing the reference or primary clock frequency.

It is also to be appreciated that the states of signal B3 and its complementary signal B3* supplied to the control inputs of sequencing transistors 208 and 209, are irrelevant to the operation of the network in the illustrated example, since all current samples passed by transistor 13 of input sampling circuit 12 are dumped by dump transistor 205. Therefore, current samples are not supplied to sequencing transistors 208 and 209.

FIG. 8C illustrates another example for operating the network at an effective sampling frequency of one-fifth that of the sampling pulse signal A1. For convenience the timing waveforms of FIG. 8C are illustrated in reduced scale relative to the timing waveforms of FIGS. 8A and 8B. Pass signals A2 and B2, and their respective complementary dump signals A2* and B2* are supplied to pass transistors 202 and 204 and dump transistors 20 and 205, respectively, by dump and sequence generator 201 with a frequency equal to one-fifth that of the sampling pulse signal. Moreover, the respective duty cycles of these pass signals is 1/5 as shown in FIGS. 8Cii and 8Ciii. In this manner, four out of every five samples produced by transistor 14 of input sampling circuit 12 are dumped by dump transistor 203, and, similarly, four out of every five samples produced by transistor 13 are dumped by dump transistor 205.

In this example, since current samples from both input sampling transistors are passed selectively through pass transistors 202 (FIG. 8Cii) and 204 (FIG. 8Ciii), sequencing transistors 206, 207, 208 and 209 need not be controlled in the manner discussed above in conjunction with FIGS. 8Biv and 8Bv in order to enable all network outputs to receive current samples. Thus, sequence control signals A3 and B3 are fixed at high logic levels by dump and sequence controller 201, thereby directing all current samples passed through pass transistor 202 to intermediate level sampling circuit 20, and, similarly, directing all current samples passed through pass transistor 204 to intermediate level sampling circuit 32.

In order to ensure that each output of the network receives current samples in turn in this example, sampling pulses A4 and B4, along with their respective complements A4* and B4*, which are supplied to the control inputs of intermediate level sampling circuit transistors 20-1, 32-1, 20-2 and 32-2, respectively, are generated by clock generator 200 with a frequency equal to one-tenth of the sampling pulse signal A1. Furthermore, sampling pulses A5 and B5, along with their respective complements A5* and B5*, which are supplied to the control inputs of the output level sampling circuit transistors, are generated by the clock generator with a frequency equal to one-twentieth the sampling pulse signal A1. Since each sampling level (except for the input level) is supplied with current samples at one-fifth the frequency that current samples are supplied thereto during full speed operation (FIG. 8A), the frequency of the corresponding control (i.e., clock) signals must be correspondingly reduced. As a result, and as can be seen in FIG. 8Cx, the network outputs are supplied with current samples in a repetitive sequence, albeit at an effective sampling frequency of one-fifth of that of the full speed operation.

It will be appreciated that clock generator 200 may be constructed as a programmable frequency divider to obtain desired sampling pulse frequencies for sampling pulses A4, B4, A5 and B5 from the fixed frequency of sampling pulse signal A1. Dump and sequence controller may be implemented by gated frequency dividing circuitry for generating the aforedescribed pass and dump control signals and the sequence control signals in response to sampling pulse signal A1, thereby carrying out the variable sampling rate operations described above. It will, of course, be apparent that the effective sampling rate of the illustrated network may be reduced as desired simply by reducing the sampling pulse frequencies at the intermediate and output levels and by selecting desired frequencies and logic states for the pass, dump and sequencing control signals, as discussed above.

Although certain applications of the preferred embodiment of the present invention as illustrated in FIG. 7 have been described and shown in FIGS. 8A-8C, the effective sampling frequency of the high-speed sampling apparatus may be reduced by other implementations that will be obvious to those of ordinary skill in the art. For example, the network shown in FIG. 7 or one similar thereto can be used to reduce the effective sampling frequency by any integral factor (i.e., by the factor 1/N, where N is an integer) by a straightforward extension of the techniques described above, without reducing the operating frequency of the primary clock source and while maintaining the use of all network outputs for current samples. In addition, dump transistors may advantageously be used to prevent new current samples from being supplied to capacitance elements 101, 102, . . . (see FIG. 2) while stored current samples are being read out therefrom, as by setting dump control signals A2* and B2* to logic high levels (i.e., by setting signals A2 and B2 low) during the read out phase of the high-speed sampling circuit thereby preventing further current samples from passing beyond input sampling circuit 12.

Another embodiment of the present invention is illustrated in the block diagram shown in FIG. 9, wherein the current switching tree circuit comprised of cascaded sets of current switching circuits of the type shown in FIG. 7 is illustrated as a plural phase switching tree circuit. Although any desirable number of phases may be used, provided that the number of phases is not an integral multiple of the division ratio of the sampling clock frequency, for convenience and in the interest of simplification, a three-phase current switching tree circuit is illustrated, designated as phases X, Y and Z, and it is seen that each phase is substantially the same as shown in FIG. 7. For simplification, the individual current switching devices which comprise the intermediate and output sets in a respective current switching tree circuit are illustrated in block diagram form. Nevertheless, the input set of current switching circuits in each tree circuit is shown schematically as switching transistors whose emitters are connected in common to an input current terminal IN.

Referring to phase X, input set 312 of current switching circuits are supplied with sampling clock pulses XA1 and XA1* generated by a clock generator, such as aforedescribed clock generator 200, a portion of which is illustrated in greater detail in block diagram form in FIG. 9. The manner in which these sampling clock pulses XA1 and XA1* are generated is described in greater detail below.

As before, input set 312 is provided with two outputs which are coupled to respective inputs of intermediate levels of current switching circuits 342 by way of a sample skipping circuit 322 and a sequencing circuit 332. Sample skipping circuit 322 may be comprised of pass transistors 202 and 204 and dump transistors 203 and 205 discussed above in conjunction with FIG. 7. Although not shown, it will be appreciated that a dump and sequence controller similar to controller 201 (FIG. 7) may be provided to generate pass signals XA2 and XB2 and complementary dump signals XA2* and XB2* in response to sampling clock pulses XA1.

Sequencing circuit 332 may be comprised of sequencing transistors 206-209, as shown in FIG. 7, for selectively coupling current samples produced by input set 312 to alternate switching circuits included in intermediate levels 342, depending upon which current samples are skipped, or dumped, by sample skipping circuit 322. Sequence signals XA3 and XB3, as well as complementary sequence signals XA3* and XB3* are supplied to sequencing circuit 332 by a sequence controller similar to dump and sequence controller 201, discussed above in conjunction with FIG. 7.

Intermediate levels 342 may be formed of intermediate sampling circuits 20 and 32, such as shown in FIG. 7, or may be formed of a plurality of cascaded sets of sampling circuits, as may be desired. Assuming that intermediate levels 342 are comprised of only one set of sampling circuits, switching pulses XA4 and XB4, as well as complementary switching pulses XA4* and XB4* are supplied to intermediate levels 342 by a clock generator similar to clock generator 200 of FIG. 7.

Intermediate levels 342 are coupled to output level 352 which may be comprised of sampling circuits 24, 26, 41 and 43, as shown in FIG. 7. These sampling circuits selectively pass to an output store 362 current samples originally generated by input set 312. The output level is responsive to sampling pulses XA5 and XB5 as well as complementary sampling pulses XA5* and XB5*, which may be produced by clock generator 200 (FIG. 7), as discussed above.

Output store 362 may include capacitance elements, A/D converters and digital storage devices for storing the respective samples produced at high speeds by input set 312. The output store is supplied with read pulses derived from the same source from which the sampling clock pulses are generated and, thus, the read pulses are synchronized with the sampling clock pulses. Output store 362 may include read-out circuits of the type described above with respect to FIG. 2.

Phase Y and phase Z of current switching tree circuits are of substantially the same construction as just-described phase X and, in the interest of brevity, further description of phases Y and Z is not provided. It will be appreciated, however, that the phase of the sampling clock pulses YA1 and YA1* supplied to input set 314 of the Y phase current switching tree circuit is shifted by 120° with respect to the sampling clock pulses supplied to the X phase of current switching tree circuits and, similarly, the sampling clock pulses ZA1 and ZA1* supplied to the Z phase of current switching tree circuits are phase-shifted by 240° with respect to the sampling clock pulses supplied to the X phase of current switching tree circuits. As a numerical example, let it be assumed that the sampling frequency of the sampling clock pulses supplied to input levels 312, 314 and 316 of the X, Y and Z phases of current switching tree circuits, respectively, is equal to 833 MHz. It will be appreciated that, since each input level is comprised of two sampling transistors and since there are three phases of current switching tree circuits, the effective sampling frequency at which an input current supplied to input terminal IN is sampled is 833 MHz × 6 = 5 GHz. It is further seen that a 120° phase shift of the sampling clock pulses supplied to input level 314 of phase Y relative to the sampling clock pulses supplied to input level 312 of phase X is equal to 200 psec. Similarly, a 120° phase shift of the sampling clock pulses supplied to input level 316 of phase Z relative to the sampling clock pulses supplied to input level 314 of phase Y corresponds to a time delay of 200 psec. It is important that these phase shifts, or time delays, be maintained accurately and that they be adjustable to compensate for changes in operating conditions, variations due to temperature changes, and the like; and that such phase shifts or time delays be capable of adjustment during a calibration mode for establishing proper operation of the respective phases of current switching tree circuits.

A suitable sampling clock pulse generator capable of providing phases X, Y and Z of current switching tree circuits with sampling clock pulses of proper phase and which, moreover, is operable to adjust the respective phases of those sampling clock pulses is illustrated in FIG. 9 as comprising crystal oscillator 302, adjustable delay circuit 305 and adjustable delay circuit 307. Crystal oscillator 302 may comprise a conventional crystal oscillator for generating clock pulses of stable, fixed frequency. For example, crystal oscillator 302 may generate clock pulses having a stable, fixed frequency of 833 MHz. These clock pulses are supplied to delay circuits 303 and 304 which impart delays of D1 and D2, respectively, to such clock pulses. As one example, each delay circuit may be comprised of a buffer circuit having an inherent delay. In the preferred embodiment, delay D1 differs from delay D2, such that D1 < D2, and it will be appreciated that delay circuit 303 may be omitted. The clock pulses produced by oscillator 302, or as may be delayed by delay circuit 303, are used as the sampling clock pulses XA1 and XA1* which are supplied to input level 312 of phase X of current switching tree circuits.

Adjustable delay circuit 305 is shown schematically in FIG. 11 and is described in greater detail hereinbelow. Suffice it to say that the adjustable delay circuit produces complementary sampling clock pulses whose times of occurrence are delayed by an amount produced by mixing the delayed clock pulses produced by delay circuits 303 and 304. Moreover, the adjustable delay circuit itself exhibits an inherent delay such that the delayed sampling clock pulses produced thereby admit of a time delay equal to the sum of this inherent delay plus an adjustable delay. As will be seen, the adjustable delay component varies from zero, that is, from a time of occurrence that coincides with the clock pulse produced by delay circuit 303, to a maximum delay which coincides with the time of occurrence of the clock pulse produced by delay circuit 304. Thus, and with respect to the clock pulses generated by crystal oscillator 302, the sampling clock pulses produced by adjustable delay circuit 305 are delayed from the crystal oscillator clock pulses by the inherent delay exhibited by the adjustable delay circuit plus a variable delay D, wherein $D1 < D < D2$. The delayed sampling clock pulses produced by adjustable delay circuit 305 are supplied to input level 314 of phase Y as sampling clock pulses YA1 and YA1*.

Adjustable delay circuit 307 may be of substantially the same construction as adjustable delay circuit 305 (to be described) and is supplied with the delayed clock pulses produced by delay circuit 304 together with these clock pulses being further delayed by delay circuit 306. As shown, delay circuit 304 is coupled directly to adjustable delay circuit 307 and is further coupled to the adjustable delay circuit by way of delay circuit 306, the latter imparting an additional time delay D3 to these clock pulses. Adjustable delay circuit 307 exhibits an inherent, fixed delay component plus a variable delay component which is a function of the mixing therein of the delayed clock pulses produced by delay circuit 304 and the further delayed clock pulses produced by delay circuit 306. Thus, the total delay imparted by adjustable delay circuit 307 to the crystal oscillator clock pulses is equal to the sum of the inherent delay component therein plus a variable component D', wherein $D2 < D' < D3$. These variable delayed sampling clock pulses produced by adjustable delay circuit 307 are supplied to input level 316 of phase Z as sampling clock pulses ZA1 and ZA1*.

The manner in which the respective phases of sampling clock pulses XA1, YA1 and ZA1 (as well as their complements XA1*, YA1* and ZA1*) are produced now will be explained in conjunction with the timing diagrams illustrated in FIGS. 10A-10H. Let it be assumed that crystal oscillator 302 generates clock pulses of the stable, fixed frequency shown in FIG. 10A. These clock pulses are delayed by an amount D1 in delay circuit 303, resulting in the delayed clock pulses shown in FIG. 10B. These clock pulses are supplied as sampling clock pulses XA1 (and the complements thereof are supplied are supplied as complementary sampling clock pulses XA1*) to input level 312 of phase X.

The crystal oscillator clock pulses (FIG. 10A) also are delayed by an amount D2 in delay circuit 304, resulting in the delayed clock pulses shown in FIG. 10C. These delayed clock pulses, as well as the complements thereof, are supplied to adjustable delay circuit 305, as are the delayed clock pulses shown in FIG. 10B (and the complements of these delayed clock pulses). As will be described in conjunction with FIG. 11, adjustable delay circuit 305 operates to produce a delayed sampling clock pulse whose time of occurrence ranges from a minimum delay relative to the crystal oscillator clock pulses (FIG. 10A), depicted in FIG. 10D, to a maximum delay depicted in FIG. 10E. The actual delay in the time of occurrence of the sampling clock pulses produced by adjustable delay circuit 305 is represented by the cross-hatched region shown in FIGS. 10D and 10E.

Preferably, the total delay exhibited by adjustable delay circuit 305 is adjusted such that the sampling clock pulses produced thereby are phase-shifted by 120°, or delayed by 200 psec, relative to the sampling clock pulses produced by delay circuit 303. As mentioned above, the adjustable delay circuit exhibits an inherent, fixed delay to which is added a variable component represented by the cross-hatched area shown in FIGS. 10D and 10E. The sum of the fixed delay and the variable component thus provides a phase shift of 120° (or a time delay of 200 psec) relative to the sampling clock pulses shown in FIG. 10B.

It will be appreciated that adjustable delay circuit 307 imparts a 120° phase shift, or 200 psec time delay, to the clock pulses produced by delay circuit 304 in a similar manner. A comparison of the relative phases, or time delays, of sampling clock pulses XA1, YA1 and ZA1 produced by delay circuit 303, adjustable delay circuit 305 and adjustable delay circuit 307, respectively, is shown in FIGS. 10F, 10G and 10H. Thus, sampling clock pulses YA1, shown in FIG. 10G, may be finely "tuned" to provide the desired phase shift, or delay, relative to the sampling clock pulses XA1 shown in FIG. 10F Likewise, the sampling clock pulses ZA1 shown in FIG. 10H may be finely "tuned" to provide the desired phase shift, or time delay, relative to the sampling clock pulses YA1 shown in FIG. 10G.

As a result of these respective phases of sampling clock pulses, the three phases of current switching tree circuits operate to provide an effective sampling frequency of 5 GHz. As discussed above, the effective sampling frequency of each phase may be reduced in accordance with the operation of sample skipping circuits 322, 324 and 326, whereby the effective sampling frequency of the overall network shown in FIG. 9 likewise may be reduced without modifying the repetition rate of the clock pulses generated by crystal oscillator 302 and without modifying the repetition rate of the sampling clock pulses supplied to the input level of the respective phases of current switching tree circuits.

Figure 11:
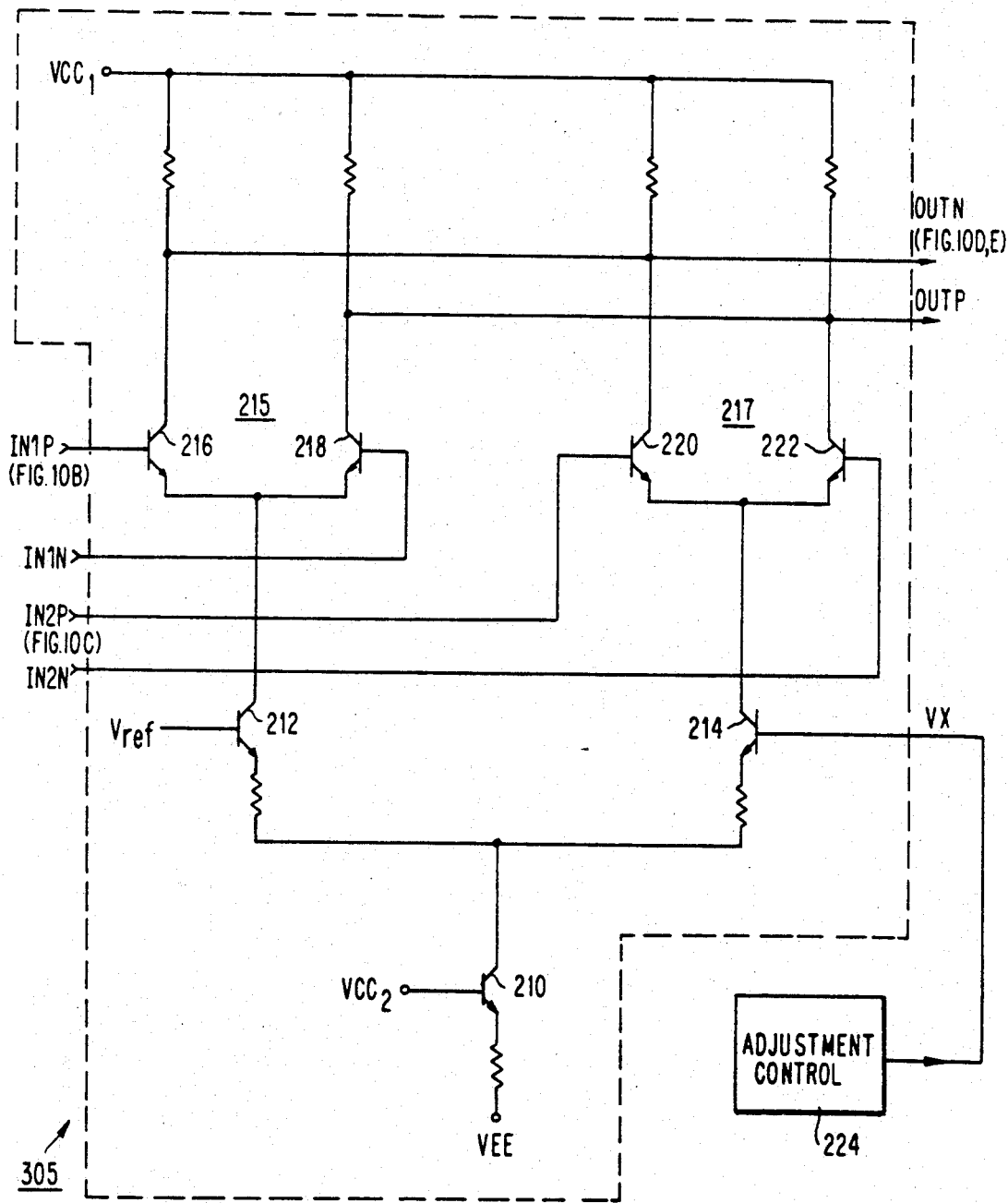
FIG. 11 is a schematic diagram of a preferred embodiment of a delay adjustment circuit used to generate sampling clock pulses in the embodiment of FIG. 9.

Turning now to FIG. 11, there is illustrated a schematic diagram of a preferred embodiment of the adjustable delay circuit which may be used to implement adjustable delay circuits 305 and 307. As illustrated, the adjustable delay circuit includes differential circuits 215 and 217, each comprised of a pair of differentially-connected transistors, such as differentially-connector transistors 216 and 218 and differentially-connected transistors 220 and 222. In the illustrated embodiment, the transistors are shown as bipolar transistors; although it will be appreciated that other transistor switching devices known to those of ordinary skill in the art may be used. Differential circuit 215 is coupled to a current source 210 by way of a current regulating reference circuit 212. Current source 210 is illustrated as a transistor whose base electrode is supplied with a sufficiently high potential to supply a constant current to differential circuits 215 and 217. Current regulating circuit 212 is coupled between the common emitters of differential circuit 215 and current source 210 and is comprised of a transistor whose base electrode is supplied with a reference voltage $V_{REF}$.

A current adjustment circuit 214, shown as a transistor, is coupled between the common emitters of differential circuit 217 and current source transistor 210. The base electrode of current adjustment transistor 214 is supplied with a variable voltage by a suitable source 224, such as a microprocessor-controlled digital-to-analog converter or other device for supplying a precise voltage during, for example, a calibration mode. As will be described, the conductivity of current adjustment transistor 214, as well as the conductivity of current regulating transistor 212, is determined by the voltage produced by source 224 which, in turn, determines the overall delay exhibited by the adjustable delay circuit.

A pulse signal is differentially applied to transistors 216 and 218 of differential circuit 215; and in one embodiment, this pulse signal may be of the type shown in FIG. 10B and produced by delay circuit 303, as well as the complement thereof (not shown). For convenience, the pulse signal differentially applied to differential circuit 215 is identified as IN1P and IN1N. Similarly, another pulse signal is differentially applied to transistors 220 and 222 included in differential circuit 217. This second pulse signal, identified as IN2P and IN2N, may be of the type shown in FIG. 10C and produced by delay circuit 304 (as well as the complement thereof, which is not shown).

The manner in which the adjustable delay circuit shown in FIG. 11 operates now will be described. Initially, let it be assumed that the control voltage applied to current adjustment transistor 214 is substantially less than $V_{REF}$. Hence, transistor 214 is cut off and substantially all of the current supplied by current source 210 flows through current regulating transistor 212. As a result, differential circuit 217 also is cut off and the output pulse signal produced by the adjustable delay circuit is derived solely from the pulse signal that is differentially applied to differential circuit 215. This output pulse signal is produced at the collector electrodes of transistors 216 and 218 and is delayed with respect to pulse signal IN1P, IN1N substantially only by the inherent delay exhibited by differential circuit 215. Thus, when current adjustment transistor 214 is cut off, the output pulse signal derived from differential circuit 215 is as shown in FIG. 10D (together with the complement thereof).

Now, let it be assumed that the control voltage supplied to current adjustment transistor 214 by source 224 is a maximum voltage, much greater than the level of reference voltage $V_{REF}$. As a result, current adjustment transistor 214 is rendered conductive, and its emitter voltage is sufficiently high to back bias current regulating transistor 212. Hence, the current regulating transistor is cut off and substantially all of the current provided by current source transistor 210 now flows through differential circuit 217. Since differential circuit 215 is cut off, the output pulse produced by adjustable delay circuit 305 appears across the collector electrodes of transistors 220 and 222 (which are connected in common with the collector electrodes of transistors 216 and 218); and this output pulse is attributed solely to the pulse applied differentially to differential circuit 217. This input pulse is shown in FIG. 10C, and when current regulating transistor 212 is cut off, the output pulse produced at, for example, the collector of transistor 220, is as shown in FIG. 10E. This output pulse is delayed from the time of occurrence of the input pulse shown in FIG. 10C substantially only by the inherent delay exhibited by differential circuit 217. (It will be appreciated that a complementary output pulse is produced at the collector of transistor 222, but in the interest of simplification, this complementary output pulse is not shown.)

Now, when the control voltage applied to current adjustment transistor 214 by source 224 varies between the aforementioned minimum and maximum levels, the conductivity of transistor 214 as well as the conductivity of current regulating transistor 212 is varied. As a consequence, the input pulse of FIG. 10B and the input pulse of FIG. 10C are mixed in a proportion determined by this control voltage. Since the respective input pulses are of similar waveforms and are simply delayed from each other, this proportionate mixture produces an output pulse whose transition is formed of proportionate components of the respective input pulses. A level corresponding to the midpoint of the transition provides a good reference which, when crossed, represents a positive-going pulse. The effect of proportionately mixing the input pulses of FIGS. 10B and 10C shifts the time of occurrence of this midpoint and, thus, shifts or delays the time of occurrence of the output pulse relative to the input pulse of FIG. 10B. Hence, the adjustable delay circuit shown in FIG. 11 produces an output pulse whose transition occurs in the range represented by the cross-hatched areas of FIGS. 10D and 10E.

While the present invention has been particularly shown and described with reference to various embodiments, it will be appreciated by those of ordinary skill in the art that various changes and modifications may be made without departing from the spirit and scope of the invention. Some alternatives have been discussed explicitly; and it is intended that the appended claims be interpreted as covering the embodiments described herein, those alternatives which have been discussed and all equivalents thereto.

What is claimed is:

1. Current switching apparatus comprising: a plurality of cascaded sets of current sampling means, including an input set and an output set, each set including at least one current switching circuit having an input and plural outputs and responsive to clock signals of different repetition rates supplied to respective sets of switching to selected outputs at a sampling frequency a current sample applied to said input, the input of a current switching circuit in one set being coupled during normal operation to a respective output of a current switching circuit in a preceding set; a clock source for supplying a clock signal of fixed frequency to said input set and of respectively different frequencies to the other sets; and sample skipping means supplied with current samples and operative to reduce an effective sampling frequency of at least one of said current switching circuits by selectively dumping predetermined current samples applied thereto while maintaining the fixed frequency of said clock signal supplied to said input set.

2. The apparatus according to claim 1 further comprising: sequencing means coupled to selected outputs of the current switching circuits in a predetermined set and operable when the effective sampling frequency is reduced for selectively switching a current sample from one of said selected outputs to an input of a current switching circuit in a succeeding set that differs from the input to which said current sample is applied when the effective sampling frequency is not reduced.

3. The apparatus according to claim 2 wherein said sequencing means is comprised of a plurality of actuable switching elements for switching said current samples from said selected outputs of the current switching circuits in said predetermined set to alternate inputs of the current switching circuits in said succeeding set; and activation means for selectively activating said switching elements.

4. The apparatus according to claim 3 wherein said activation means includes means for activating said switching elements in sequence.

5. The apparatus according to claim 3 wherein each said switching element is comprised of a bi-polar transistor.

6. The apparatus according to claim 3 wherein each said switching element is comprised of a MOS transistor.

7. Current switching apparatus comprising: a plurality of cascaded sets of current sampling means, including an input set and an output set, each set including at least one current switching circuit having an input and plural outputs and responsive to clock signals of different repetition rates supplied to respective sets for switching to selected outputs at a sampling frequency a current sample applied to said input, the input of a current switching circuit in one set being coupled during normal operation to a respective output of a current switching circuit in a preceding set; a clock source for supplying a clock signal of fixed frequency to said input set and of respectively different frequencies to the other sets; and sample skipping means for reducing an effective sampling frequency of at least one of said current switching circuits while maintaining the fixed frequency of said clock signal supplied to said input set, said sample skipping means includes: passing means coupled between the selected outputs of the current switching circuits in a predetermined set and the inputs of the current switching circuits in a succeeding set and selectively energized to pass said current samples therethrough; dumping means connected in parallel with said passing means and selectively energized to dump said current samples from said selected outputs of the current switching circuits in said predetermined set; and control means for selectively energizing said passing means and said dumping means.

8. The apparatus according to claim 7 wherein said passing means and said dumping means are comprised of bi-polar transistors.

9. The apparatus according to claim 7 wherein said passing means and said dumping means are comprised of MOS transistors.

10. The apparatus according to claim 7 wherein said control means is operable to energize said dumping means for inhibiting all of said current samples from being applied from said selected outputs of the current switching circuits in said predetermined set to the current switching circuits in the succeeding set.

11. The apparatus according to claim 7 wherein said control means is operable to energize said passing means in a repeatable periodic pattern such that m of every successive n current samples are passed from said predetermined set to the succeeding set; where m and n are positive integers and m is less than n.

12. Current switching apparatus comprising: a plurality of cascaded sets of current switching means, including an input set and an output set, each set including at least one current switching circuit having an input and plural outputs and responsive to clock signals supplied thereto for switching a current applied to said input to selected ones of said outputs, the input of a current switching circuit in one set being coupled to a respective output of a current switching circuit in a preceding set to receive a current therefrom during normal operation; means coupled to predetermined outputs of the current switching circuits in a predetermined set for selectively dumping or passing current switched thereto in response to respective predetermined transitions of said clock signals; and a clock generator for generating said clock signals.

13. The apparatus according to claim 12 wherein said means for selectively dumping or passing current is coupled to the predetermined outputs of the current switching circuits in said input set.

14. The apparatus according to claim 12 wherein said means for selectively dumping or passing current is comprised of: passing means coupled between the predetermined outputs of the current switching circuits in said predetermined set and the inputs of the current switching circuits in a succeeding set and selectively energizable to pass said current switched to said predetermined outputs; and dumping means connected in parallel with said passing means and selectively energizable to dump said current from said predetermined outputs of the current switching circuits in said predetermined set.

15. The apparatus according to claim 14 wherein said passing means is comprised of at least one actuable passing switching element and said dumping means is comprised of at least one actuable dumping switching element to form a pair of switching elements; and further comprising activation means for activating one switching element of a pair.

16. The apparatus according to claim 15 wherein said activation means includes means for alternately activating the switching elements of said pair in a selected sequence.

17. The apparatus according to claim 15 wherein each said passing switching element and each said dumping switching element is comprised of a bi-polar transistor.

18. The apparatus according to claim 15 wherein each said passing switching element and each said dumping switching element is comprised of a MOS transistor.

19. The apparatus according to claim 12 further comprising: sequencing means operable when current is dumped for selectively switching a current from predetermined outputs of the current switching circuits in a predetermined set to the inputs of current switching circuits in a succeeding set that differ from the inputs to which a current is switched when current is passed.

20. The apparatus according to claim 19 wherein said sequencing means is comprised of a plurality of actuable switching elements for switching said current from said predetermined outputs of the current switching circuits in said predetermined set to alternate inputs of the current switching circuits in said succeeding set; and activation means for selectively activating said switching elements.

21. The apparatus according to claim 20 wherein said activation means includes means for activating said switching elements in sequence.

22. The apparatus according to claim 20 wherein each said switching element is comprised of a bi-polar transistor.

23. The apparatus according to claim 20 wherein each said switching element is comprised of a MOS transistor.

24. The apparatus according to claim 19 wherein said means for selectively dumping or passing current and said sequencing means are both coupled to said predetermined outputs of the current switching circuits in the same set.

25. The apparatus according to claim 24 wherein said same set is said input set.

26. The apparatus according to claim 12 further comprising: analog storage means coupled to the respective outputs of the current switching circuits of said output set of current switching means to store charges derived from currents switched to the respective outputs of said output set; read-out means coupled to said analog storage means and energizable to read out the values of said stored charges; and means for activating all of said means for selectively dumping or passing current substantially concurrently for dumping current from said current switching means in the predetermined set when said read-out means is energized to read out the values of said stored charges.

27. Plural phase current switching apparatus comprising plural phases of current switching tree circuits, each phase including an input set of current switching circuits supplied with sampling clock pulses, an output set of current switching circuits and at least one intermediate set of current switching currents, each set having an input and plural outputs with the input of one set being coupled to a respective output of a preceding set; plural phase clock generating means for generating plural phases of sampling clock pulses of fixed frequency and including adjustable delay means for delaying a respective phase of sampling clock pulses by an adjustable delay and thereby establishing predetermined phases of sampling clock pulses of the same frequency and different phases; means for supplying said plural phases of sampling clock pulses to the input sets of current switching circuits in said plural phases of current switching tree circuits, respectively; plural phases of switching pulse generating means for deriving from said plural phases of sampling clock pulses respective phases of switching pulses of different repetition rates, each phase of switching pulses being supplied to a respective phase of current switching tree circuits for driving the intermediate and output sets therein at said different repetition rates; and plural phases of sample skipping means, each coupled to a respective phase of current switching tree circuits for reducing an effective sampling frequency thereof by selectively dumping predetermined current samples applied thereto while maintaining the fixed frequency of the sampling clock pulses supplied to the input set of current switching circuits included in said respective phase of current switching tree circuits.

28. Plural phase current switching apparatus comprising plural phases of current switching tree circuits, each phase including an input set of current switching circuits supplied with sampling clock pulses, an output set of current switching circuits and at least one intermediate set of current switching circuits, each set having an input and plural outputs with the input of one set being coupled to a respective output of a preceding set; plural phase clock generating means for generating plural phases of sampling clock pulses of fixed frequency and including adjustable delay means for delaying a respective phase of sampling clock pulses by an adjustable delay and thereby establishing predetermined phases of sampling clock pulses of the same frequency and different phases; means for supplying said plural phases of sampling clock pulses to the input sets of current switching circuits in said plural phases of current switching tree circuits, respectively; plural phases of switching pulse generating means for deriving from said plural phases of sampling clock pulses respective phases of switching pulses of different repetition rates, each phase of switching pulses being supplied to a respective phase of current switching tree circuits for driving the intermediate and output sets therein at said different repetition rates; and plural phases of sample skipping means, each coupled to a respective phase of current switching tree circuits for reducing an effective sampling frequency thereof while maintaining the fixed frequency of the sampling clock pulses supplied to the input set of current switching circuits included in said respective phase of current switching tree circuits, wherein each phase of the sample skipping means comprises passing means coupled between successive sets of current switching circuits in a respective phase of current switching tree circuits and selectively energized to pass current samples therethrough; dumping means connected in parallel with said passing means and selectively energized to dump said current samples; and control means for selectively energizing said passing means and said dump means.

29. The apparatus of claim 28 wherein said control means is operable to energize said dumping means for inhibiting all of the current samples from being applied to a succeeding set of current switching circuits.

30. The apparatus of claim 28 wherein said control means is operable to energize said passing means in a repeatable periodic pattern such that m of every n current samples are passed to a succeeding set of current switching circuits, where m and n are positive integers and m<n.

31. The apparatus of claim 27 wherein said adjustable delay means comprises first differential circuit means for receiving a first pulse signal differentially applied thereto; second differential circuit means for receiving a second pulse signal differentially applied thereto, said second pulse signal being delayed with respect to said first pulse signal; current supply means for supplying current to said first and second differential circuit means; current adjustment means for varying the current supplied by said current supply means to one of said differential circuit means relative to the current supplied to the other differential circuit means; and output means coupled to said first and second differential circuit means for producing an output pulse at a time of occurrence which varies between a first time corresponding to said first pulse and a second time corresponding to said second pulse as a function of said current adjustment means.

32. The apparatus of claim 31 wherein said current adjustment means comprise at least two differentially-connected transistor devices each having emitter circuits connected in common to said current supply means and collector circuits connected to respective ones of said first and second differential circuit means.

33. The apparatus of claim 32 further comprising means for supplying a fixed reference voltage to one of said differentially-connected transistor devices and means for supplying a variable voltage to the other differentially-connected transistor devices to vary the conduction of the differentially-connected transistor devices.

34. The apparatus of claim 33 wherein said first and second differential circuit means exhibit an inherent delay such that the time of occurrence of said output pulse is substantially equal to the sum of said inherent delay and a delay determined by said current adjustment means.

35. The apparatus of claim 34 further comprising first input means for differentially supplying said first pulse signal to said first differential circuit means at a first delayed time relative to a reference time, and second input means for differentially supplying said second pulse signal to said second differential circuit means at a second delayed time relative to said reference time, whereby the first time of occurrence of said output pulse is substantially equal to the sum of said inherent delay and said first delayed time and the second time of occurrence of said output pulse is substantially is equal to the sum of said inherent delay and said second delayed time.

36. Plural phase current switching apparatus comprising plural phases of current switching tree circuits, each phase including an input set of current switching circuits supplied with sampling clock pulses, an output set of current switching circuits and at least one intermediate set of current switching circuits, each set having an input and plural outputs with the input of one set being coupled to a respective output of a preceding set; plural phase clock generating means for generating plural phases of sampling clock pulses of fixed frequency and including adjustable delay means for delaying a respective phase of sampling clock pulses by an adjustable delay and thereby establishing predetermined phases of sampling clock pulses of the same frequency and different phases; means for supplying said plural phases of sampling clock pulses to the input sets of current switching circuits in said plural phases of current switching tree circuits, respectively; plural phases of switching pulse generating means for deriving from said plural phases of sampling clock pulses respective phases of switching pulses of different repetition rates, each phase of switching pulses being supplied to a respective phase of current switching tree circuits for driving the intermediate and output sets therein at said different repetition rates; plural phases of sample skipping means, each coupled to a respective phase of current switching tree circuits for reducing an effective sampling frequency thereof while maintaining the fixed frequency of the sampling clock pulses supplied to the input set of current switching circuits included in said respective phase of current switching tree circuits; and plural phases of sequencing means, each coupled to the plural outputs of a predetermined set of current switching circuits in a respective phase of current switching tree circuits and operable when the effective sampling frequency is reduced for selectively switching a current sample received at one output of said predetermined set to an input of the succeeding set which differs from the input to which said current sample otherwise is switched when the effective sampling frequency is not reduced.

37. The apparatus of claim 36 wherein said sequencing means is comprised of a plurality of actuable switching elements for switching said current samples from the plural outputs of said predetermined set to alternate inputs of the succeeding set; and activation means for selectively activating said switching elements.

* * * * *

UNITED STATES PATENT AND TRADEMARK OFFICE
CERTIFICATE OF CORRECTION

PATENT NO. : 5,218,363
DATED : Jun. 8, 1993
INVENTOR(S) : LeCroy, Jr. et al.

It is certified that error appears in the above-indentified patent and that said Letters Patent is hereby corrected as shown below:

Item [63]
On the cover page, on the second line under the heading "Related U.S. Application Data", please delete "abandoned".

Signed and Sealed this

Third Day of December, 1996

Attest:

BRUCE LEHMAN

*Attesting Officer*     *Commissioner of Patents and Trademarks*